（12）United States Patent
Suzuki

(10) Patent No.: US 8,704,213 B2
(45) Date of Patent: Apr. 22, 2014

(54) PHOTOELECTRIC CONVERSION DEVICE AND SOLID-STATE IMAGING

(75) Inventor: Hideyuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 352 days.

(21) Appl. No.: 13/281,815

(22) Filed: Oct. 26, 2011

(65) Prior Publication Data

US 2012/0098079 A1    Apr. 26, 2012

(30) Foreign Application Priority Data

Oct. 26, 2010    (JP) ................. 2010-240185

(51) Int. Cl.
*H01L 51/46*    (2006.01)

(52) U.S. Cl.
USPC .............. 257/40; 257/E51.012; 257/E51.026; 257/E51.039

(58) Field of Classification Search
USPC .............. 257/40, E51.12–E51.017, E51.026, 257/E51.039, 432–466
See application file for complete search history.

(56) References Cited

U.S. PATENT DOCUMENTS

| 5,178,980 A * | 1/1993 | Mort et al. ................ 430/58.05 |
| 2005/0224905 A1 | 10/2005 | Forrest et al. |
| 2006/0226770 A1 | 10/2006 | Lee |
| 2007/0063156 A1 | 3/2007 | Hayashi |
| 2008/0035965 A1 | 2/2008 | Hayashi et al. |
| 2008/0299293 A1 | 12/2008 | Shiena et al. |
| 2009/0188547 A1 * | 7/2009 | Hayashi et al. ............... 136/249 |

FOREIGN PATENT DOCUMENTS

| EP | 2 194 055 A1 | 6/2010 |
| JP | 2006-073856 A | 3/2006 |
| JP | 2006-295163 A | 10/2006 |
| JP | 2007-088033 A | 4/2007 |
| JP | 2009-182095 A | 8/2009 |

OTHER PUBLICATIONS

Extended European Search Report dated Apr. 3, 2013 in European Application No. 11186674.5.
Office Action dated Feb. 5, 2013 in Japanese Application No. 2010-240185.

* cited by examiner

*Primary Examiner* — Calvin Lee
*Assistant Examiner* — Scott Stowe
(74) *Attorney, Agent, or Firm* — Sughrue Mion, PLLC

(57) ABSTRACT

A photoelectric conversion device having: a pair of electrodes; a photoelectric conversion layer sandwiched between the pair of electrodes; and at least one electron blocking layer provided between one electrode of the pair of electrodes and the photoelectric conversion layer, wherein the photoelectric conversion layer contains at least one organic material, and the at least one electron blocking layer has a mixed layer containing fullerene or fullerene derivatives.

14 Claims, 2 Drawing Sheets

PHOTOELECTRIC CONVERSION DEVICE AND SOLID-STATE IMAGING

CROSS-REFERENCE TO RELATED APPLICATION(S)

The present application claims priority from Japanese Patent Application No. 2010-240185 filed on Oct. 26, 2010, the entire content of which is incorporated herein by reference.

BACKGROUND

1. Field

The present invention relates to a solid-state imaging device and a solid-state imaging device useful in a photosensor, a photoelectric conversion device.

2. Description of Related Art

A conventional photosensor in general is a device fabricated by forming a photodiode (PD) in a semiconductor substrate such as silicon (Si), and as for the solid-state imaging device, a flat solid-state imaging device is widely used where PDs are two-dimensionally arranged in a semiconductor substrate and a signal according to a signal charge generated by photoelectric conversion in each PD is read out through a CCD or CMOS circuit.

Development of a photoelectric conversion device using an organic compound is on the way. An organic photoelectric conversion device having a structure in which a plurality of functional layers such as a photoelectric conversion layer generating an electric charge by absorbing light and an electric charge blocking layer suppressing an electric charge injection from an electrode are laminated is disclosed in JP-A-2007-88033 (the term "JP-A" as used herein means an "unexamined published Japanese patent application"). In order to manufacture the imaging device using the organic photoelectric conversion device, it is necessary to perform a color filter forming process or a wire bonding process in addition to the organic compound layer and electrode forming process. In these processes, since the imaging device is heated to 200° C. or more, heat resistance of 200° C. or more is required in the organic photoelectric conversion film used in the imaging device.

JP-A-2006-73856 suggests a photoelectric conversion device in which a photoelectric conversion layer has a plurality of mixed layers of an electron acceptor and an electron donor and having different mixing ratios is disclosed. However, all the mixed layers are used as the photoelectric conversion layer in order to increase a photoelectric conversion efficiency, and there is no description regarding the heat resistance.

JP-A-2009-182095 discloses a configuration in which fullerene is contained in the electric charge blocking layer, not in the photoelectric conversion layer. However, there is no description regarding the heat resistance. Further, fullerene is used for transporting electrons using a characteristic of an n-type organic semiconductor, and used in a hole blocking layer in order to suppress the hole injection from the electrode.

Until now, sensitivity of the photoelectric conversion device using the organic compound is decreased or a dark current thereof is increased when heat is applied, such that more improvement may be required in heat resistance.

SUMMARY

The present invention has been made in an effort to provide a photoelectric conversion device and a solid-state imaging device that can obtain sufficient sensitivity and heat resistance, and exhibit a high speed response property.

In the organic photoelectric conversion device, in order to implement a high photoelectric conversion efficiency, a low dark current property, and a high speed response property, it is required that the used organic photoelectric conversion film (photoelectric conversion layer) satisfies the following requirements. 1. With respect to the high efficiency and the high speed response, it is required that a signal charge can be rapidly transferred to both electrodes without loss after an exciton is dissociated. It is required that the number of sites trapping carriers is small, mobility is high, and electric charge transportability is high. 2. With respect to the high photoelectric conversion efficiency, it is preferable that stabilization energy of the exciton is low, and the exciton is rapidly dissociated (high exciton dissociation efficiency) by an electric field applied from the outside, or an electric field generated in the inside by a pn-junction. 3. In order to decrease the carriers generated in the inside under a dark state as much as possible, it is preferable to select a film structure and a material having a small amount of impurities which are one of the factors of an intermediate level of the inside. 4. In the case where a plurality of layers is laminated, it is required that energy levels of adjacent layers are matched, and the electric charge transporting is obstructed if an energy barrier is formed.

In consideration of an application to a manufacturing process having a heating process such as installation of a color filter, formation of a protective film and soldering of a device, or an improvement of a preservation property, there is a need for a material for a photoelectric conversion device and a film including the material to have a high heat resistance.

In the case where an organic photoelectric conversion film is formed, a deposition method is preferable in that thermal decomposition is suppressed during the deposition as a decomposition temperature is increased compared to a deposition feasible temperature. An application coating method is preferable in that a film is formed without subjecting to a limitation by the decomposition as described above, and a low cost can be realized. However, since uniform film formation is facilitated and a possibility of introducing impurities is reduced, formation of the film by the deposition method is preferable.

The present inventor has extensively examined and found out that the following selection and combination of materials as a means for capable of satisfying the above requirements and realizing high photoelectric conversion efficiency, low dark current property, high speed response property and heat resistance.

According to the studies of the present inventor, it has been found that a photoelectric conversion device having particularly high heat resistance is manufactured by providing at least one electron blocking layer between an electrode and a photoelectric conversion layer, and using at least one layer of the electron blocking layers as a mixed layer containing fullerene or fullerene derivatives, as compared to the case where fullerene or fullerene derivatives are not contained in the electron blocking layer. Thermal stability of the film may be increased by mixing the fullerene or fullerene derivatives having high thermal stability into the electron blocking layer. Moreover, it has been found out that even though the fullerene or fullerene derivatives that is an n-type organic semiconductor is contained in the electron blocking layer, a characteristic of the photoelectric conversion device is not deteriorated.

(1) A photoelectric conversion device having: a pair of electrodes; a photoelectric conversion layer sandwiched between the pair of electrodes; and at least one electron blocking layer provided between one electrode of the pair of electrodes and the photoelectric conversion layer, wherein the photoelectric conversion layer contains at least one organic material, and the at least one electron blocking layer has a mixed layer containing fullerene or fullerene derivatives.

(2) The photoelectric conversion device according to (1), wherein the electron blocking layer is formed with a plurality of layers, the plurality of layers has: a layer containing the fullerene or fullerene derivatives of 10% or less in volume ratio, and the mixed layer containing: a material other than the fullerene or fullerene derivative contained in the layer containing the fullerene or fullerene derivatives of 10% or less in volume ratio; and the fullerene or fullerene derivatives.

(3) The photoelectric conversion device according to (2), wherein the layer containing the fullerene or fullerene derivatives of 10% or less in volume ratio is in contact with the electrode.

(4) The photoelectric conversion device according to (1), wherein the content of the fullerene or fullerene derivative contained in the mixed layer is 30% to 70% in volume ratio.

(5) The photoelectric conversion device according to (4), wherein the mixed layer is in contact with the photoelectric conversion layer.

(6) The photoelectric conversion device according to (1), wherein the photoelectric conversion layer is a bulk hetero layer contains an n-type organic semiconductor material and a p-type organic semiconductor material are mixed.

(7) The photoelectric conversion device according to (6), wherein the n-type organic semiconductor material is fullerene or fullerene derivative.

(8) The photoelectric conversion device according to (7), wherein the bulk hetero layer contains the fullerene or fullerene derivative of 40% to 80% in volume ratio.

(9) The photoelectric conversion device according to (1), wherein a thickness of the electron blocking layer is 20 nm or more.

(10) The photoelectric conversion device according to (1), wherein an ionization potential (Ip) of the electron blocking layer is 5.2 eV or more.

(11) The photoelectric conversion device according to (1), wherein a thickness of the mixed layer is 5 nm or more.

(12) The photoelectric conversion device according to (1), wherein the thickness of the mixed layer is 10 nm or more.

(13) The photoelectric conversion device according to (1), wherein the mixed layer contains an organic compound having glass-transition temperature of 200° C. or more.

(14) A solid-state imaging device having: the plurality of photoelectric conversion devices according to (1); a plurality of color filters provided on each of the photoelectric conversion devices; and a signal read-out portion that reads-out a signal according to an electric charge generated in the photoelectric conversion layers of the photoelectric conversion devices.

According to the embodiments of the present invention, since sufficient sensitivity and heat resistance can be obtained, a photoelectric conversion device and a solid-state imaging device that have a high speed response property can be provided.

DETAILED DESCRIPTION OF INVENTION

[Photoelectric Conversion Device]

A photoelectric conversion device according to the embodiment of the present invention includes a pair of electrodes, a photoelectric conversion layer sandwiched between the pair of electrodes, and at least one electron blocking layer provided between one electrode of the pair of electrodes and the photoelectric conversion layer. In particular, the photoelectric conversion layer includes at least one organic material and at least one electron blocking layer is a mixed layer containing fullerene or fullerene derivatives.

FIG. 1 shows configuration example of the photoelectric conversion device according to the embodiment of the present invention.

Figure 1A:
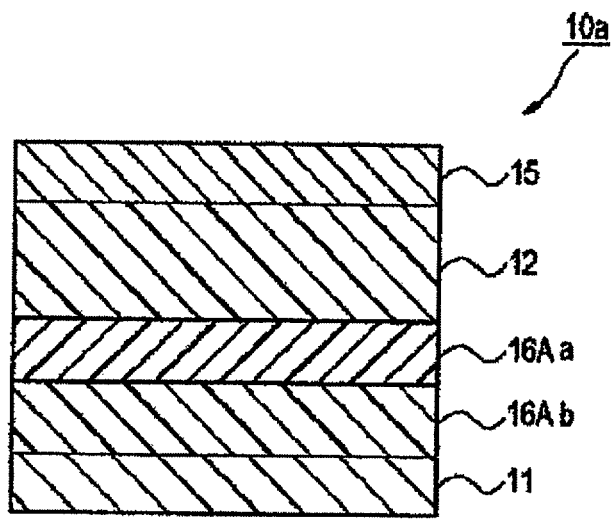
FIG. 1A and FIG. 1B each illustrates a schematic cross-sectional view showing one configuration example of a photoelectric conversion device.

A photoelectric conversion device 10a shown in FIG. 1A has a configuration in which an electron blocking layer 16 formed on a conductive film (hereinafter, referred to as the lower electrode) 11 acting as the lower electrode, a photoelectric conversion layer 12 formed on the electron blocking layer 16, and a transparent conductive film (hereinafter, referred to as upper electrode) 15 acting as a upper electrode are laminated in this order. The electron blocking layer 16 has a configuration in which an electron blocking layer 16Ab and a mixed layer 16Aa formed on the electron blocking layer 16Ab are laminated.

Figure 1B:
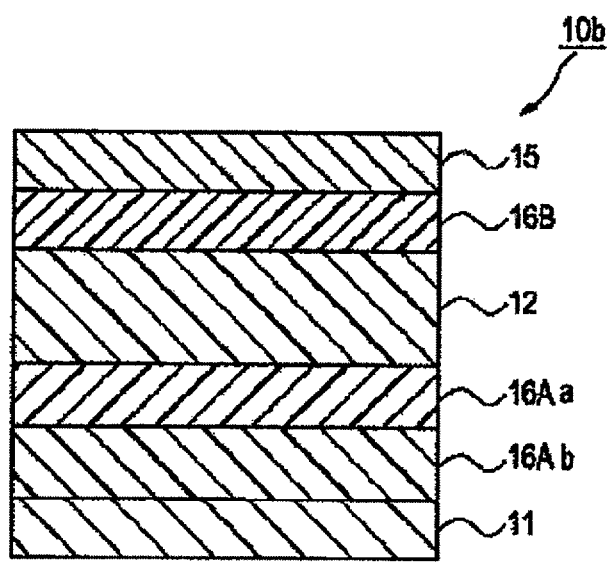

FIG. 1B shows another configuration example of another photoelectric conversion device. A photoelectric conversion device 10b shown in FIG. 1B has a configuration in which the electron blocking layer 16Ab, the mixed layer 16Aa, the photoelectric conversion layer 12, the hole blocking layer 16B, and the upper electrode 15 are laminated in this order on the lower electrode 11. On the other hand, the lamination order of the electron blocking layer, the mixed layer, the photoelectric conversion layer, and the hole blocking layer of FIG. 1A and FIG. 1B may be reversed according to usage or properties.

In this configuration, it is preferable that light is incident to the organic photoelectric conversion film through the transparent conductive film.

In the case where the photoelectric conversion devices are used, an electric field may be applied. In this case, the conductive film and the transparent conductive film define a pair of electrodes, and an electric field of, for example, 1 V/cm or more and $10^7$ V/cm or less may be applied between the pair of electrodes.

Elements constituting the photoelectric conversion device according to the embodiment of the present invention will be described.

(Electrode)

The electrodes (the upper electrode (transparent conductive film) 15 and the lower electrode (conductive film) 11)) are constituted by a conductive material. As the conductive material, for example, there may be metal, metal oxides, metal nitrides, metal borides, an organic conductive compound, and a mixture thereof. As detailed examples thereof, there may be conductive metal oxides such as tin oxide, zinc oxide, indium oxide, indium tin oxide (ITO), indium zinc oxide (IZO), indium tungsten oxide (IWO) and titanium oxide, metal nitrides such as titanium nitride (TiN), metal such as gold (Au), platinum (Pt), silver (Ag), chromium (Cr), nickel (Ni), aluminum (Al), mixtures or laminates of the metals and the conductive metal oxides, an organic conductive compound such as polyaniline, polythiophene and polypyrrole, and laminates of the organic conductive compound and ITO.

Since light is incident from the upper electrode 15, the upper electrode 15 needs to be sufficiently transparent with respect to light to be detected. In detail, there may be the conductive metal oxide such as tin oxide (ATO, FTO) in which antimony or fluorine is doped, tin oxide, zinc oxide, indium oxide, indium tin oxide (ITO), and zinc indium oxide (IZO), the thin metal film such as gold, silver, chromium, and nickel, mixtures or laminates of the metals and the conductive metal oxides, an inorganic conductive material such as copper iodide and copper sulfide, the organic conductive compound such as polyaniline, polythiophene, and polypyrrole, and laminates of the organic conductive compound and ITO. Among the materials, in views of the high conductivity and transparency, the transparent conductive metal oxide is preferable. It is preferable that the transparent conductive film is directly formed on the organic photoelectric conversion film. Since the upper electrode 15 is formed on the photoelectric conversion layer 12, it is preferable that the upper electrode is formed by using a method that a characteristic of the photoelectric conversion layer 12 is not deteriorated.

The lower electrode 11 includes, according to usage, a case where a material capable of reflecting light is used without imparting transparency, conversely, a case where transparency is imparted. For example, there may be metal, metal oxides, metal nitrides, metal borides, the organic conductive compound, and a mixture thereof. As detailed examples thereof, there may be conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag), chromium (Cr), nickel (Ni), aluminum (Al), mixtures or laminates of the metals and the conductive metal oxides, an organic conductive compound such as polyaniline, polythiophene, and polypyrrole, and laminates of the organic conductive compound and ITO. Any one material of titanium nitride, molybdenum nitride, tantalum nitride, and tungsten nitride is particularly preferable as the material of a pixel electrode.

A method for forming the electrode is not particularly limited, but may be appropriately selected in consideration of suitability with the electrode material. In detail, the electrode may be formed by a wet method such as a printing method and a coating method, a physical method such as a vacuum deposition method, a sputtering method, and an ion plating method, and a chemical method such as CVD, and a plasma CVD method.

In the case where the material of the electrode is ITO, the electrode may be formed by an electron beam method, a sputtering method, a resistance heating deposition method, a chemical reaction method (sol-gel method), and a method such as coating of dispersion materials of indium tin oxide. In addition, UV-ozone treatment and plasma treatment may be performed to the film manufactured by using ITO. In the case where the material of the electrode is TiN, various methods including a reactive sputtering method are used, and UV-ozone treatment and plasma treatment may be performed.

It is preferable that the upper electrode 15 is manufactured in a plasma-free state. By manufacturing the upper electrode 15 in a plasma-free state, an influence of the plasma on the substrate may be decreased, such that a characteristic of the photoelectric conversion may be improved. Herein, the plasma-free means a state where the plasma is not generated in formation of the upper electrode 15, or where a distance from a plasma generation source to the substrate is 2 cm or more, preferably 10 cm or more, and more preferably 20 cm or more, and a state where an amount of plasma delivered to the substrate becomes small.

As an apparatus where a plasma is not generated in formation of the upper electrode 15, there is, for example, an electron beam deposition apparatus (EB deposition apparatus) or a pulse laser deposition apparatus. With respect to the EB deposition apparatus or pulse laser deposition apparatus, the apparatuses disclosed in "New Development of Transparent Conductive Film" (published by CMC Publishing Co. Ltd., 1999) under the supervision of Sawada Yutaka, "New Development of Transparent Conductive Film II" (published by CMC Publishing Co. Ltd., 2002) under the supervision of Sawada Yutaka, "Technology of Transparent Conductive Film" (Ohmsha, Ltd., 1999) written by the Japan Society for the Promotion of Science (JSPS) and references added thereto may be used. Hereinafter, a method for forming the transparent electrode film by using the EB deposition apparatus is called an EB deposition method, and a method for forming the transparent electrode film by using the pulse laser deposition apparatus is called a pulse laser deposition method.

With respect to an apparatus for realizing a state where a distance from the plasma generation source to the substrate is 2 cm or more, and an amount of plasma reached the substrate becomes small (hereinafter, referred to as a plasma-free film forming apparatus), for example, a counter target sputter apparatus or an arc plasma deposition method may be considered. With respect to those apparatus and method, the apparatuses disclosed in "New Development of Transparent Conductive Film" (published by CMC Publishing Co. Ltd., 1999) under the supervision of Sawada Yutaka, "New Development of Transparent Conductive Film II" (published by CMC Publishing Co. Ltd., 2002) under the supervision of Sawada Yutaka, "Technology of Transparent Conductive Film" (Ohmsha, Ltd., 1999) written by the Japan Society for the Promotion of Science (JSPS) and references added thereto may be used.

In the case where the transparent conductive film such as TCO is the upper electrode 15, DC short-circuiting or leakage current may be increased. One of these reasons is that fine cracks introduced into the photoelectric conversion layer 12 are covered by a dense film such as TCO, such that conduction with a first electrode film 11 placed at an opposite side is increased. Accordingly, in the case of the electrode made of Al having a poor film quality, it is difficult to increase leakage current. An increase of the leakage current may be largely suppressed by controlling the film thickness of the upper electrode 15 with respect to the film thickness of the photoelectric conversion layer 12 (that is, a depth of crack). The thickness of the upper electrode 15 may be ⅕ or less and preferably 1/10 or less of the thickness of the photoelectric conversion layer 12.

In general, if the conductive film is formed thinner than a predetermined range, a resistance value is rapidly increased, but in the solid-state imaging device into which the photoelectric conversion device according to the present embodiment is inserted, a sheet resistance value may preferably be 100 Ω/square to 10000 Ω/square, such that the degree of freedom of the film thickness range utilized in film thinning is large. In addition, as the thickness of the upper electrode (transparent conductive film) 15 is decreased, a quantity of absorbed light is decreased, such that in general, light transmittance is increased. An increase of the light transmittance is preferable in that light absorption in the photoelectric conversion layer 12 is increased, and thus the photoelectric conversion ability is increased. In consideration of suppression of the leakage current, an increase of thin film resistance, and an increase of transmittance accompanied by the film thinning, the film thickness of the upper electrode 15 is preferably 5 nm to 100 nm, and more preferably 5 nm to 20 nm.

[Photoelectric Conversion Layer]

The photoelectric conversion layer 12 is a layer that includes an organic photoelectric conversion material receiving light and generating an electric charge in accordance with a quantity of light thereof. As the material of the photoelectric conversion layer 12, it is preferable to use a material having sensitivity to a visible ray. The material of the photoelectric conversion layer 12 is not particularly limited, but performance of the organic photoelectric conversion device may be better when forming a layer having a bulk hetero structure in which a p-type organic semiconductor material and an n-type organic semiconductor material are mixed with each other.

The p-type organic semiconductor material (compound) is a donor organic semiconductor (compound), represented by a hole transporting organic compound, and an organic compound having a property of easily donating electrons. In more detail, the p-type organic semiconductor material is an organic compound having a smaller ionization potential when two organic materials are in contact. Accordingly, the donor organic compound may be any organic compound if the organic compound is an electron donating organic compound. For example, a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, merocyanine compound, an oxonol compound, a polyamine compound, indole compound, a pyrrole compound, a pyrazole compound, a polyarylene compound, a condensed aromatic carbon ring compound (a naphthalene derivative, an anthracene derivative, a phenanthrene derivative, a tetracene derivative, a pyrene derivative, a perylene derivative, and a fluoranthene derivative) or a metal complex having a nitrogen containing heterocyclic compound as a ligand may be used. Meanwhile, the donor organic compound is not limited thereto, and may be used as a donor organic semiconductor if the organic compound is an organic compound having a smaller ionization potential than an organic compound used as an n-type (acceptor) compound as described above.

The n-type organic semiconductor material (compound) is an acceptor organic semiconductor (compound), represented by an electron transporting organic compound, and an organic compound having a property of easily accepting electrons. In more detail, the n-type organic semiconductor material is an organic compound having higher electron affinity when two organic materials are in contact. Accordingly, the acceptor organic compound may be any organic compound if the organic compound is an electron accepting organic compound. For example, a condensed aromatic carbon ring compound (a naphthalene derivative, an anthracene derivative, a phenanthrene derivative, a tetracene derivative, a pyrene derivative, a perylene derivative, and a fluoranthene derivative), 5 to 7 membered heterocyclic compounds containing a nitrogen atom, an oxygen atom and a sulfur atom (for example, pyridine, pyrazine, pyrimidine, pyridazine, triazine, quinoline, quinoxaline, quinazoline, phtalazine, cinnoline, isoquinoline, pteridine, acridine, phenazine, phenanthroline, tetrazole, pyrazole, imidazole, thiazole, oxazole, indazole, benzimidazole, benzotriazole, benzooxazole, benzothiazole, carbazole, purine, triazolopyridazine, triazolopyrimidine, tetrazaindene, oxadiazole, imidazopyridine, pyrrolizine, pyrrolopyridine, and thiadiazolopyridine), a polyarylene compound, a fluorene compound, a cyclopentadiene compound, a silly compound, or a nitrogen containing heterocyclic compound as a ligand may be used. On the other hand, the acceptor organic compound is not limited thereto, and may be used as an acceptor organic semiconductor if the organic compound is an organic compound having larger electron affinity than an organic compound used as the donor organic compound as described above.

As an organic colorant used in the photoelectric conversion layer, any matter may be used, but it is preferable that a p-type organic colorant or an n-type organic colorant is used. Any matter may be used as the organic colorant, but preferably, may be a cyanine colorant, a styryl colorant, a hemicyanine colorant, a merocyanine colorant (including zeromethine merocyanine (simple merocyanine)), a tri-nuclear merocyanine colorant, a tetra-nuclear merocyanine colorant, a rhodacyanine colorant, a complex cyanine colorant, a complex merocyanine colorant, an allophore colorant, an oxonol colorant, a hemioxonol colorant, a squarylium colorant, a croconium colorant, an azamethine colorant, a coumarin colorant, an arylidene colorant, an anthraquinone colorant, a triphenylmethane colorant, an azo colorant, an azomethine colorant, a Spiro compound, a metallocene colorant, a fluorenone colorant, a fulgide colorant, a perylene colorant, a perinone colorant, a phenazine colorant, a phenothiazine colorant, a quinone colorant, a diphenylmethane colorant, a polyene colorant, an acridine colorant, an acrydinone colorant, a diphenylamine colorant, a quinacrydone colorant, a quinophthalone colorant, a phenoxazine colorant, a phthaloperylene colorant, a diketopyrrolopyrrole colorant, a dioxane colorant, a porphyrine colorant, a chlorophyl colorant, a phthalocyanine colorant, a metal complex colorant, and a condensed aromatic carbon ring-based colorant (a naphthalene derivative, an anthracene derivative, a phenanthrene derivative, a tetracene derivative, a pyrene derivative, a perylene derivative, and a fluoranthene derivative).

As a color imaging device that is one of the objects of the present invention, a methine colorant having the high degree of freedom of adjustment of an absorption wavelength, such as a cyanine colorant, a styryl colorant, a hemicyanine colorant, a merocyanine colorant, a tri-nuclear merocyanine colorant, a tetra-nuclear merocyanine colorant, a rhodacyanine colorant, a complex cyanine colorant, a complex merocyanine colorant, an allophore colorant, an oxonol colorant, a hemioxonol colorant, a squarylium colorant, a croconium colorant, and an azamethine colorant, may provide preferable wavelength suitability.

Preferably, the p-type organic semiconductor material is represented by the following General Formula (1):

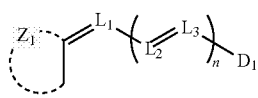

General Formula (1)

In General Formula (1), $Z_1$ is a ring including at least two carbon atoms, and represents a condensed ring including a 5-membered ring, a 6-membered ring or at least one of the 5-membered ring and 6-membered ring. Each of $L_1$, $L_2$ and $L_3$ independently represents an unsubstituted methine group or a substituted methine group. $D_1$ represents an atomic group. n represents an integer of 0 or more).

$Z_1$ is a ring including at least two carbon atoms, and represents a condensed ring including a 5-membered ring, a 6-membered ring or at least one of the 5-membered ring and 6-membered ring. As the condensed ring including the 5-membered ring, 6-membered ring or at least one of the 5-membered ring and 6-membered ring, in general, a matter used as an acidic nucleus in a merocyanine colorant is preferable, and detailed examples may be, for example, the following matters.

(a) 1,3-dicarbonyl nucleus: for example, 1,3-indandione nucleus, 1,3-cyclohexanedione, 5,5-dimethyl-1,3-cyclohexanedione and 1,3-dioxane-4,6-dione.

(b) pyrazolinone nucleus: for example, 1-phenyl-2-pyrazoline-5-one, 3-methyl-1-phenyl-2-pyrazoline-5-one and 1-(2-benzothiazoyl)-3-methyl-2-pyrazoline-5-one.

(c) isoxazolinone nucleus: for example, 3-phenyl-2-isoxazoline-5-one and 3-methyl-2-isoxazoline-5-one.

(d) oxyindole nucleus: for example, 1-alkyl-2,3-dihydro-2-oxyindole.

(e) 2,4,6-triketohexahydropyrimidine nucleus: for example, a barbituric acid or a 2-thiobarbituric acid and derivatives thereof. The derivatives may be, for example, a 1-alkyl substituted derivative such as 1-methyl, and 1-ethyl, a 1,3-dialkyl system such as 1,3-dimethyl, 1,3-diethyl and 1,3-dibutyl, a 1,3-diaryl substituted derivative such as 1,3-diphenyl, 1,3-di(p-chlorophenyl) and 1,3-di(p-ethoxycarbonylphenyl), a 1-alkyl-1-aryl substituted derivative such as 1-ethyl-3-phenyl and a 1,3-diheterocycle substituted derivative such as 1,3-di(2-pyridyl).

(f) 2-thio-2,4-thiazolidinedione nucleus: for example, rhodanine and a derivative thereof. The derivative may be, for example, 3-alkylrhodanine such as 3-methylrhodanine, 3-ethylrhodanine and 3-allylrhodanine, 3-arylrhodanine such as 3-phenylrhodanine, and 3-heterocycle substituted rhodanine such as 3-(2-pyridyl)rhodanine.

(g) 2-thio-2,4-oxazolidinedione (2-thio-2,4-(3H,5H)-oxazoledione) nucleus: for example, 3-ethyl-2-thio-2,4-oxazolidinedione.

(h) thianaphthenone nucleus: for example, 3(2H)-thianaphthenone-1,1-dioxide.

(i) 2-thio-2,5-thiazolidinedione nucleus: for example, 3-ethyl-2-thio-2,5-thiazolidinedione.

(j) 2,4-thiazolidinedione nucleus: for example, 2,4-thiazolidinedione, 3-ethyl-2,4-thiazolidinedione and 3-phenyl-2,4-thiazolidinedione.

(k) thiazoline-4-one nucleus: for example, 4-thiazolinone, and 2-ethyl-4-thiazolinone.

(l) 2,4-imidazolidinedione (hidantoin) nucleus: for example, 2,4-imidazolidinedione and 3-ethyl-2,4-imidazolidinedione.

(m) 2-thio-2,4-imidazolidinedione (2-thiohidantoin) nucleus: for example, 2-thio-2,4-imidazolidinedione and 3-ethyl-2-thio-2,4-imidazolidinedione.

(n) imidazoline-5-one nucleus: for example, 2-propylmercapto-2-imidazoline-5-one.

(o) 3,5-pyrazolidinedione nucleus: for example, 1,2-diphenyl-3,5-pyrazolidinedione and 1,2-dimethyl-3,5-pyrazolidinedione.

(p) benzothiophene-3-one nucleus: for example, benzothiophene-3-one, oxobenzothiophene-3-one and dioxobenzothiophene-3-one.

(q) indanon nucleus: for example, 1-indanon, 3-phenyl-1-indanon, 3-methyl-1-indanon, 3,3-diphenyl-indanon and 3,3-dimethyl-1-indanon.

The ring represented by $Z_1$ is preferably a 1,3-dicarbonyl nucleus, a pyrazolinone nucleus, a 2,4,6-triketohexahydropyrimidine nucleus (including a thioketone system, for example, a barbituric acid nucleus and a 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazoline-5-one nucleus, a 3,5-pyrazolidinedione nucleus, a benzothiophene-3-one nucleus and an indanone nucleus, and more preferably a 1,3-dicarbonyl nucleus, a 2,4,6-triketohexahydropyrimidine nucleus (including a thioketone system, for example, a barbituric acid nucleus, and a 2-thiobarbituric acid nucleus), a 3,5-pyrazolidinedione nucleus, a benzothiophene-3-one nucleus, and an indanon nucleus, and more preferably a 1,3-dicarbonyl nucleus, a 2,4,6-triketohexahydropyrimidine nucleus (including a thioketone system, for example, a barbituric acid nucleus, and a 2-thiobarbituric acid nucleus), and particularly preferably a 1,3-indandione nucleus, a barbituric acid nucleus, a 2-thiobarbituric acid nucleus and a derivative thereof.

Each of $L_1$, $L_2$ and $L_3$ independently represents an unsubstituted methine group or a substituted methine group. A ring (e.g. a 6-membered ring, for example, a benzene ring) may be formed by bonding the substituted methine groups. Although the substituent group of the substituted methine group may be a substituent group W, it is preferable that all of $L_1$, $L_2$ and $L_3$ are unsubstituted methine groups.

$L_1$ to $L_3$, together with each other, may form a ring. The formed ring may be a cyclohexene ring, a cyclopentene ring, a benzene ring, and a thiophene ring.

n represents an integer of 0 or more, preferably an integer of 0 to 3, and more preferably 0. In the case where n is increased, the absorption wavelength region may be a long wavelength, or a decomposition temperature by heat is decreased. Since appropriate absorption is provided in a visible ray region and heat decomposition is suppressed during the deposition and formation of the layer, it is preferable that n is 0.

$D_1$ represents an atomic group. The case where $D_1$ is a group including $-NR^a(R^b)$ is preferable, and the case where $-NR^a(R^b)$ is a substituted arylene group is more preferable. Each of $R^a$ and $R^b$ independently represents a hydrogen atom or a substituent group.

The arylene group represented by $D_1$ is preferably an arylene group having 6 to 30 carbon atoms, and more preferably an arylene group having 6 to 18 carbon atoms. The arylene group may have a substituent group W as described below, and is preferably an arylene group having 6 to 18 carbon atoms, which may have an alkyl group having 1 to 4 carbon atoms. For example, there may be a phenylene group, a naphthylene group, an anthracenylene group, a pyrenylene group, a phenanthrenylene group, a methylphenylene group and a dimethylphenylene group. A phenylene group or a naphthylene group is preferable.

The substituent group represented by $R^a$ or $R^b$ may be a substituent group W as described below, and is preferably an aliphatic hydrocarbon group (preferably an alkyl group or an alkenyl group that may be substituted), an aryl group (preferably a phenyl group that may be substituted) or a heterocyclic group.

Each of the aryl groups represented by $R^a$ or $R^b$ independently is preferably an aryl group having 6 to 30 carbon atoms and more preferably an aryl group having 6 to 18 carbon atoms. The aryl group may have a substituent group, and is preferably an aryl group having 6 to 18 carbon atoms, which may have an alkyl group having 1 to 4 carbon atoms, or an aryl group having 6 to 18 carbon atoms. For example, there may be a phenyl group, a naphthyl group, an anthracenyl group, a pyrenyl group, a phenanthrenyl group, a methylphenyl group, a dimethylphenyl group and a biphenyl group. A phenyl group or a naphthyl group is preferable.

Each of the heterocyclic groups represented by $R^a$ or $R^b$ independently is preferably a heterocyclic group having 3 to 30 carbon atoms and more preferably a heterocyclic group having 3 to 18 carbon atoms. The heterocyclic group may have a substituent group, and preferably a heterocyclic group having 3 to 18 carbon atoms, which may have an alkyl group having 1 to 4 carbon atoms, or an aryl group having 6 to 18 carbon atoms. In addition, it is preferable that the heterocyclic group represented by $R^a$ or $R^b$ is a condensed ring structure, and preferably a condensed ring structure of combination of rings selected from the group consisting of a furan ring, a thiophene ring, a selenophene ring, a silole ring, a pyridine ring, pyrazine ring, a pyrimidine ring, an oxazole ring, a thiazole ring, a triazole ring, a oxadiazole ring and a thiadiazole ring (the rings may be the same as each other). A quinoline ring, an isoquinoline ring, a benzothiophene ring, a dibenzothiophene ring, a thienothiophene ring, a bithienobenzene ring and a bithienothiophene ring are preferable.

The arylene group and aryl group represented by $D_1$, $R^a$ or $R^b$ are preferably a benzene ring or a condensed ring structure, and more preferably a condensed ring structure containing a benzene ring. A naphthalene ring, an anthracene ring, a pyrene ring, and a phenanthrene ring are exemplified, and a benzene ring, a naphthalene ring or an anthracene ring is more preferable, and a benzene ring or a naphthalene ring is more preferable.

The substituent group W may be a halogen atom, an alkyl group (including a cycloalkyl group, a bicycloalkyl group and a tricycloalkyl group), an alkenyl group (including a cycloalkenyl group, and a bicycloalkenyl group), an alkynyl group, an aryl group, a heterocyclic group (may be called a heterocyclic group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an imide group, a phosphino group, a phosphynyl group, a phosphynyloxy group, a phosphynylamino group, a phosphono group, a silyl group, a hydrazino group, a ureido group, a boronic group (—B(OH)$_2$), a phosphate group (—OPO(OH)$_2$), a sulfate group (—OSO$_3$H), and other known substituent groups.

In the case where $R^a$ and $R^b$ represent a substituent group (preferably an alkyl group, and an alkenyl group), the substituent groups may form a ring (preferably a 6-membered ring) together with a hydrogen atom or a substituent group on the aromatic ring (preferably benzene ring) structure in which —NR$^a$(R$^b$) is a substituted to aryl group. In this case, it is preferable that the substituent group is represented by General Formula (VIII), (IX) or (X) as described below.

$R^a$ and $R^b$, together with each other, may form a ring (preferably a 5-membered or a 6-membered ring, and more preferably a 6-membered ring), and $R^a$ and $R^b$ may form a ring (preferably a 5-membered or a 6-membered ring, and more preferably a 6-membered ring) together with the substituent group on L (any one of $L_1$, $L_2$ and $L_3$).

The compound represented by General Formula (1) is a compound as disclosed in JP-A-2000-297068. Some compound that has not been disclosed in JP-A-2000-297068 may be prepared by using a synthesis method disclosed in JP-A-2000-297068.

It is preferable that the compound represented by General Formula (1) is a compound represented by General Formula (2).

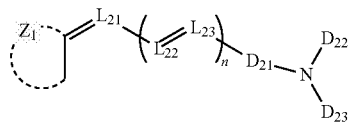

General Formula (2)

In General Formula (2), $Z_2$, $L_{21}$, $L_{22}$, $L_{23}$ and n are the same as $Z_1$, $L_1$, $L_2$, $L_3$ and n of General Formula (1), and preferable examples thereof are the same. $D_{21}$ represents a substituted or unsubstituted arylene group. Each of $D_{22}$ and $D_{23}$ independently represents a substituted or unsubstituted aryl group or a substituted or unsubstituted heterocyclic group.

The arylene group represented by $D_{21}$ is the same as the arylene ring group represented by $D_1$ and preferable examples thereof are the same.

Each of the aryl groups represented by $D_{22}$ and $D_{23}$ independently represents the same as heterocyclic groups represented by $R^a$ and $R^b$, and preferable examples thereof are the same.

Preferable detailed examples of the compound represented by General Formula (1) are shown as General Formula (3), but the present invention is not limited thereto.

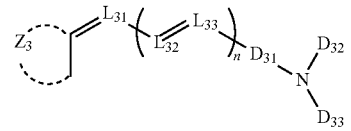

General Formula (3)

In General Formula (3), $Z_3$ represents any one of A-1 to A-12 in Formula 4. $L_{31}$ represents methylene, and n represents 0. $D_{31}$ is any one of B-1 to B-9, and $D_{32}$ and $D_{33}$ represent any one of C-1 to C-16. As $Z_3$, A-2 is preferable, $D_{32}$ and $D_{33}$ are preferably selected from C-1, C-2, C-15 and C-16, and $D_{31}$ is preferably B-1 or B-9.

Formula 4

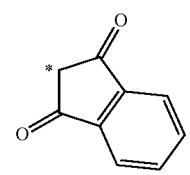 [SMILES: O=C1CC(=O)c2ccccc21]

A-1

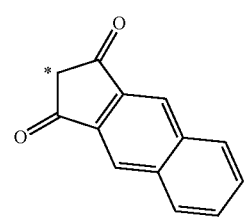 [SMILES: O=C1CC(=O)c2cc3ccccc3cc21]

A-2

-continued
Formula 4
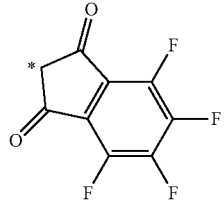 [SMILES: O=C1CC(=O)c2c(F)c(F)c(F)c(F)c21] A-3
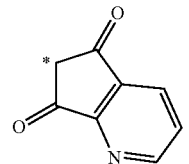 [SMILES: O=C1CC(=O)c2ncccc21] A-4
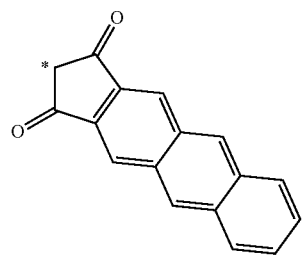 [SMILES: O=C1CC(=O)c2cc3cc4ccccc4cc3cc21] A-5
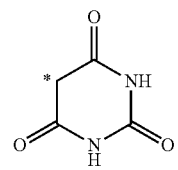 A-6
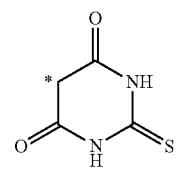 A-7
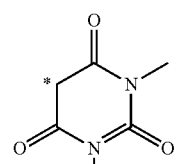 A-8
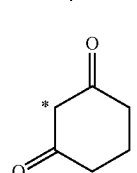 A-9
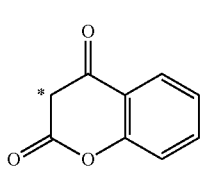 [SMILES: O=C1CC(=O)c2ccccc2O1] A-10
-continued
Formula 4
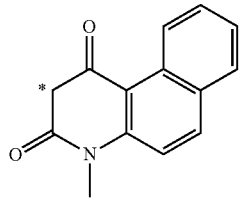 [SMILES: CN1C(=O)CC(=O)c2c1ccc1ccccc21] A-11
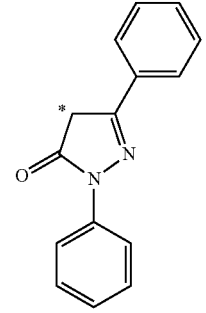 [SMILES: O=C1CC(c2ccccc2)=NN1c1ccccc1] A-12
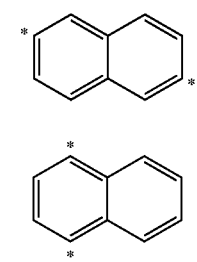 B-1
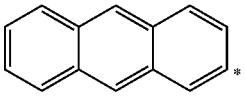 B-2
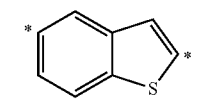 B-3
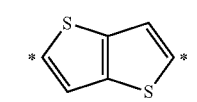 B-4
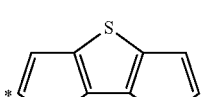 B-5
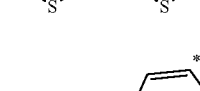 B-6
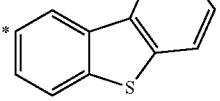 B-7
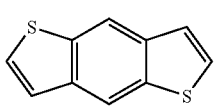 B-8

Formula 4

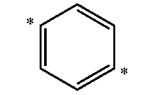 B-9

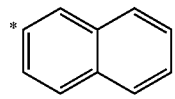 C-1

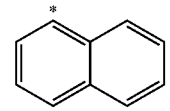 C-2

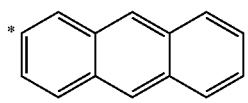 [SMILES: c1ccc2cc3ccccc3cc2c1] C-3

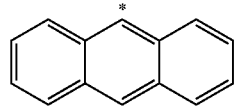 [SMILES: c1ccc2cc3ccccc3cc2c1] C-4

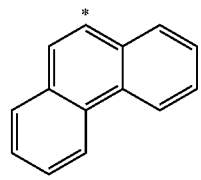 [SMILES: c1ccc2c(c1)ccc1ccccc12] C-5

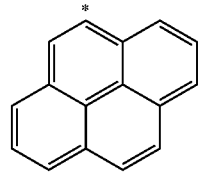 [SMILES: c1cc2ccc3cccc4ccc(c1)c2c34] C-6

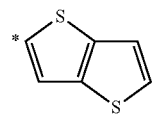 C-7

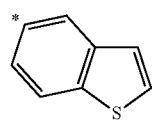 C-8

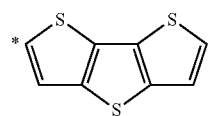 [SMILES: c1cc2sc3ccsc3c2s1] C-9

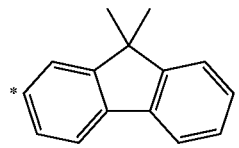 C-10

Formula 4

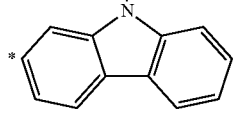 C-11

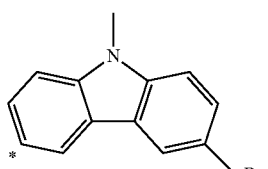 C-12

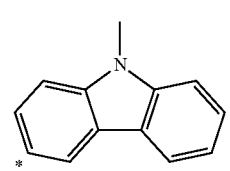 C-13

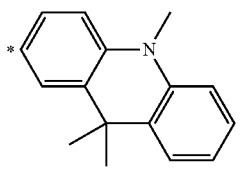 [SMILES: CN1c2ccccc2C(C)(C)c2ccccc21] C-14

 C-15

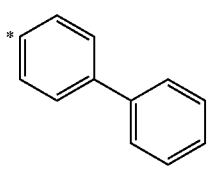 [SMILES: c1ccc(-c2ccccc2)cc1] C-16

(in Table, "*" represents a bonding site)

The particularly preferable p-type organic material may be a dye or a material not having a structure of five or more condensed rings (a material having a structure of 0 to 4 condensed rings and preferably 1 to 3 condensed rings). If a pigment-based p-type material generally used in an organic thin film solar cell is used, current is easily increased in a dark state at a p/n interface, and a light response is delayed by an intercrystal trap, such that it is difficult to use the pigment-based p-type material in imaging devices. Accordingly, a dye-based p-type material that is difficult to be crystallized or a material not having five or more condensed ring structures may be used for imaging devices.

More preferable detailed examples of the compound represented by General Formula (1) are combinations of the following substituent groups, linking groups and partial structures in General Formula (3), but the present invention is not limited thereto.

Formula 5

| Compound | $Z_3$ ring | $L_{31}$ | n | $D_{31}$ | $D_{32}$ | $D_{33}$ |
|---|---|---|---|---|---|---|
| 1 | A-1 | CH | 0 | B-9 | C-1 | C-1 |
| 2 | A-2 | CH | 0 | B-1 | C-1 | C-1 |
| 3 | A-3 | CH | 0 | B-9 | C-15 | C-15 |
| 4 | A-4 | CH | 0 | B-9 | C-15 | C-15 |
| 5 | A-5 | CH | 0 | B-9 | C-15 | C-15 |
| 6 | A-10 | CH | 0 | B-9 | C-15 | C-15 |
| 7 | A-11 | CH | 0 | B-9 | C-15 | C-15 |
| 8 | A-6 | CH | 0 | B-1 | C-15 | C-15 |
| 9 | A-7 | CH | 0 | B-1 | C-15 | C-15 |
| 10 | A-8 | CH | 0 | B-1 | C-15 | C-15 |
| 11 | A-9 | CH | 0 | B-1 | C-15 | C-15 |
| 12 | A-12 | CH | 0 | B-1 | C-15 | C-15 |
| 13 | A-2 | CH | 0 | B-2 | C-15 | C-15 |
| 14 | A-2 | CH | 0 | B-3 | C-15 | C-15 |
| 15 | A-2 | CH | 0 | B-9 | C-15 | C-15 |
| 16 | A-2 | CH | 0 | B-9 | C-16 | C-16 |
| 17 | A-1 | CH | 0 | B-9 | C-16 | C-16 |
| 18 | A-2 | CH | 0 | B-9 | C-1 | C-1 |
| 19 | A-2 | CH | 0 | B-1 | C-1 | C-2 |
| 20 | A-2 | CH | 0 | B-1 | C-1 | C-15 |
| 22 | A-2 | CH | 0 | B-1 | C-1 | C-3 |
| 23 | A-2 | CH | 0 | B-9 | C-15 | C-4 |
| 24 | A-2 | CH | 0 | B-9 | C-15 | C-5 |
| 25 | A-2 | CH | 0 | B-9 | C-15 | C-6 |
| 26 | A-2 | CH | 0 | B-9 | C-7 | C-7 |
| 27 | A-2 | CH | 0 | B-9 | C-8 | C-8 |
| 28 | A-2 | CH | 0 | B-1 | C-10 | C-10 |
| 29 | A-2 | CH | 0 | B-9 | C-11 | C-11 |
| 30 | A-2 | CH | 0 | B-9 | C-12 | C-12 |
| 31 | A-2 | CH | 0 | B-4 | C-15 | C-15 |
| 32 | A-2 | CH | 0 | B-5 | C-15 | C-15 |
| 33 | A-2 | CH | 0 | B-6 | C-15 | C-15 |
| 34 | A-2 | CH | 0 | B-7 | C-15 | C-15 |
| 35 | A-2 | CH | 0 | B-8 | C-15 | C-15 |

Meanwhile, A-1 to A-12, B-1 to B-9 and C-1 to C-16 of Formula 5 are the same as those shown in Table 1.

Particularly preferable detailed examples of the compound represented by General Formula (1) are shown below, but the present invention is not limited thereto.

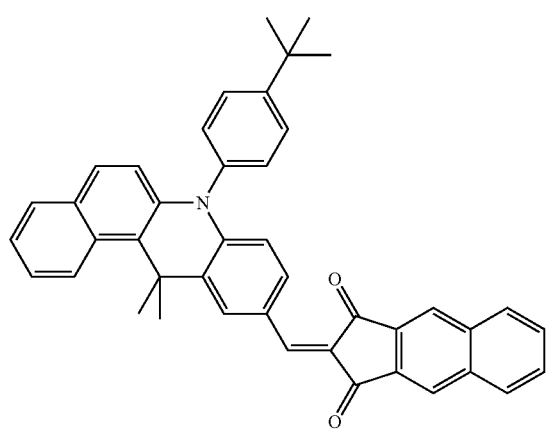

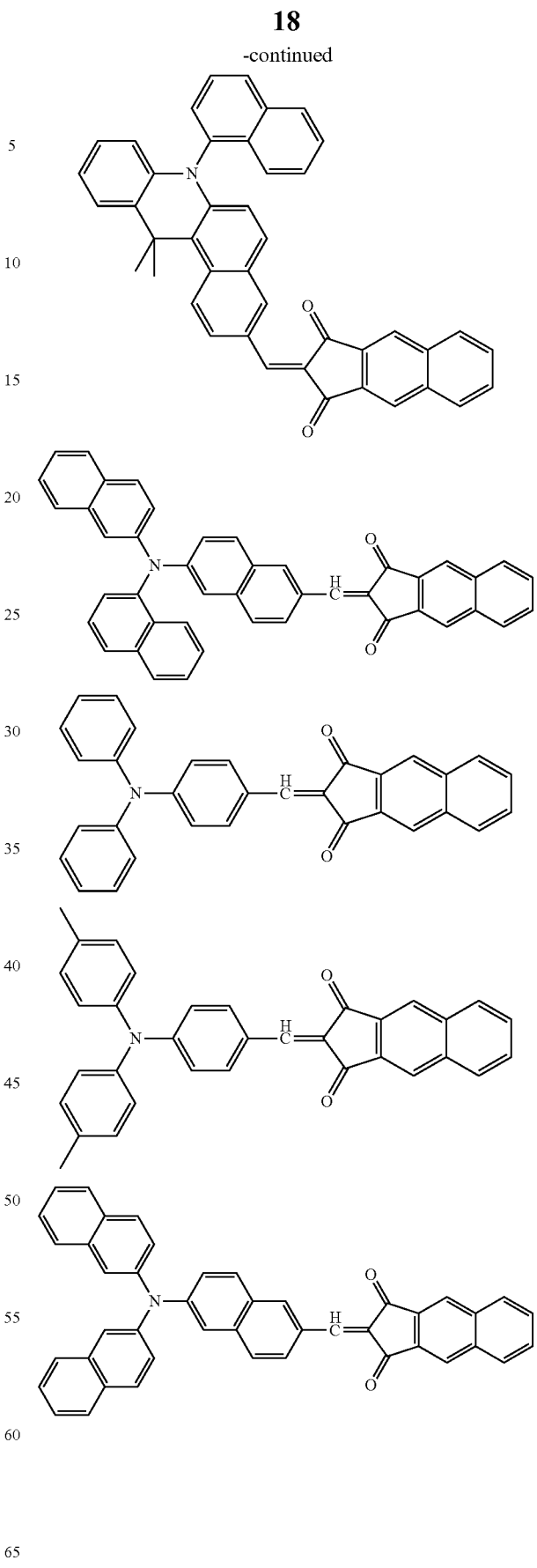

-continued

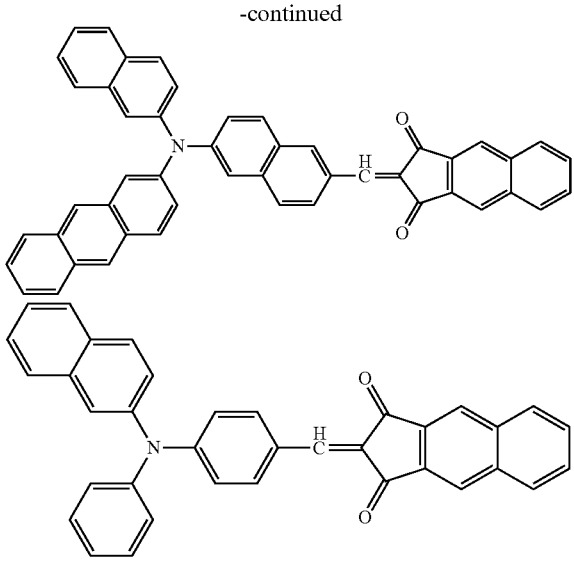

(Molecular Weight)

The molecular weight of the compound represented by General Formula (1), in view of suitability to the formation of the layer, is preferably 300 to 1500, more preferably 350 to 1200, and still more preferably 400 to 900. When the molecular weight is excessively small, the film thickness of the formed photoelectric conversion layer is decreased due to volatilization, and on the contrary to this, when the molecular weight is excessively large, it is impossible to perform deposition, such that it is impossible to manufacture the photoelectric conversion device.

(Melting Point)

The melting point of the compound represented by General Formula (1), in view of stability of deposition, is preferably 200° C. or more, more preferably 220° C. or more, and still more preferably 240° C. or more. If the melting point is low, melting is performed before the deposition, such that it is impossible to stably form the layer, and since the amount of decomposed materials of the compound is increased, performance of the photoelectric conversion is degraded.

(Absorption Spectrum)

The peak wavelength of the absorption spectrum of the compound represented by General Formula (1), in view of wide absorption of light of a visible region, is preferably 450 to 700 nm, more preferably 480 to 700 nm, and still more preferably 510 to 680 nm.

(Molar Extinction Coefficient of the Peak Wavelength)

The higher the molar extinction coefficient of the compound represented by General Formula (1) is, the better the effective use of light is. In the visible region in which the absorption spectrum (chloroform solution) is in a wavelength of 400 to 700 nm, the molar extinction coefficient is preferably 20000 $M^{-1}cm^{-1}$ or more, more preferably 30000 $M^{-1}cm^{-1}$ or more, and still more preferably 40000 $M^{-1}cm^{-1}$ or more.

It is preferable that the organic photoelectric conversion film includes an n-type organic semiconductor material in addition to the compound represented by General Formula (1). It is more preferable that the n-type organic semiconductor material is included in the photoelectric conversion layer 12 together with the compound represented by General Formula (1).

[Fullerene or Fullerene Derivatives]

It is preferable that the n-type organic semiconductor material is fullerene or fullerene derivatives.

The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube, and the fullerene derivatives indicate compounds obtained by adding a substituent to such a fullerene. The substituent is preferably an alkyl group an aryl group or a heterocyclic group.

The compounds described in JP-A-2007-123707 are preferred as fullerene derivatives.

As fullerene and fullerene derivatives, the compounds described in Scientific Review Quarterly edited by the Chemical Society of Japan No. 43 (1999), JP-A-10-167994, JP-A-11-255508, JP-A-11-255509, JP-A-2002-241323 and JP-A-2003-196881 may be used.

Among the fullerene and fullerene derivatives, fullerene is preferable, and fullerene $C_{60}$ is particularly preferable.

In the organic photoelectric conversion film, it is preferable that the compound represented by General Formula (1) and fullerene or fullerene derivatives form a bulk hetero structure in a mixed state. The bulk hetero structure is a film (bulk hetero layer) in which the p-type organic semiconductor (compound represented by General Formula (1)) and the n-type organic semiconductor are mixed and dispersed in the photoelectric conversion layer, and, for example, may be formed by a co-deposition method. The photoelectric conversion efficiency of the photoelectric conversion layer may be improved by including the bulk hetero structure such that a disadvantage in that a carrier diffusion length of the photoelectric conversion layer is short is compensated. Meanwhile, the bulk hetero structure is described in detail in JP-A-2005-303266, paragraphs [0013] and [0014].

It is preferable that the bulk hetero layer contains fullerene or fullerene derivatives of 40% to 80% in volume ratio, and it is more preferable that the bulk hetero layer contains fullerene or fullerene derivatives of 50% to 70% in volume ratio.

The organic photoelectric conversion film may be formed by a dry film forming method or a wet film forming method. As detailed examples of the dry film forming method, there may be a vacuum deposition method, a sputtering method, an ion plating method, a physical vapor growth method such as a MBE method or a CVD method such as plasma polymerization. As the wet film forming method, a cast method, a spin coat method, a dipping method, and a LB method are used. The dry film forming method is preferable, and the vacuum deposition method is more preferable. In the case where the layer is formed by the vacuum deposition method, manufacturing conditions such as the degree of vacuum and a deposition temperature may be determined according to a general method.

The thickness of the photoelectric conversion layer is preferably 10 to 1000 nm, more preferably 50 to 800 nm, and particularly preferably 100 to 500 nm. It is possible to obtain a suitable dark current suppression effect by setting the thickness to 10 nm or more, and it is possible to obtain suitable photoelectric conversion efficiency by setting the thickness to 1000 nm or less.

[Charge Blocking Layer: Electron Blocking Layer, Hole Blocking Layer]

(Electron Blocking Layer)

The electron blocking layer is a layer for preventing electrons from being injected from the electrode into the photoelectric conversion layer, and is constituted by a single layer or a multi-layer. The electron blocking layer may be constituted by an organic material single film, a mixed layer of a plurality of various organic materials, or a mixed layer of the organic material and fullerene or fullerene derivatives.

It is preferable that the electron blocking layer is constituted by a material that has a high electron injection barrier from the adjacent electrode and a high hole transporting property. In the electron injection barrier, it is preferable that the electron affinity of the electron blocking layer is smaller than the work function of the adjacent electrode by 1 eV or more. 1.3 eV or more is more preferable, and 1.5 eV or more is particularly preferable.

In order to sufficiently suppress a contact between the electrode and the photoelectric conversion layer and avoid an influence of defects or dust existing on a surface of the lower electrode, the electron blocking layer is preferably 20 nm or more, more preferably 40 nm or more, and particularly preferably 60 nm or more. In addition, the film thickness of the electron blocking layer is preferably 300 nm or less, more preferably 200 nm or less, and still more preferably 100 nm or less.

When the electron blocking layer is constituted by a plurality of layers, the total film thickness of the electron blocking layer is preferably 300 nm or less, more preferably 200 nm or less, and still more preferably 100 nm or less.

If the thickness of the electron blocking layer is in the above range, in order to apply appropriate intensity of electric field to the photoelectric conversion layer, it is possible to suppress increase of required supply voltage. In addition, a carrier transporting process in the electric electron blocking layer does not negatively affect performance of the photoelectric conversion device.

An electron donating organic material may be used in the electron blocking layer. In detail, if the electron donating organic material is a low molecular material, an aromatic diamine compound such as N,N-bis(3-methylphenyl)-1,1'-biphenyl)-4,4'-diamine (TPD) or 4,4'-bis[N-(naphthyl)-N-phenyl-amino]biphenyl (α-NPD), a porphirin compound such as oxazole, oxadiazole, triazole, imidazole, imidazolone, a stilbene derivative, a pyrazoline derivative, tetrahydroimidazole, polyarylalkane, butadiene, 4,4',4"-tris(N-(3-methylphenyl)N-phenylamino)triphenylamine(m-MTDATA), porphine, copper tetraphenylporphine, phthalocyanine, copper phthalocyanine and titanium phthalocyanineoxide, a triazole derivative, an oxadiazole derivative, an imidazole derivative, a polyarylalkane derivative, a pyrazoline derivative, a pyrazolone derivative, a phenylenediamine derivative, an anylamine derivative, an amino substituted calcone derivative, an oxazole derivative, a styrylanthracene derivative, a fluorenone derivative, a hydrazone derivative and a silazane derivative may be used. In a case where the electron donating organic material is the polymer material, a polymer such as phenylenevinylene, fluorene, carbazole, indole, pyrene, pyrrole, picholine, thiophene, acetylene and diacetylene or a derivative thereof may be used. Even though a compound is not an electron donating compound, if the compound has a sufficient hole transporting property, the compound can be used.

An inorganic material may be used as the electron blocking layer. In general, since dielectricity of an inorganic material is larger than that of the organic material, in the case where the inorganic material is used in the electron blocking layer, a great quantity of voltage is applied to the photoelectric conversion layer, thereby increasing the photoelectric conversion efficiency. As the material that may be used in the electron blocking layer, there are calcium oxide, chromium oxide, chromium copper oxide, manganese oxide, cobalt oxide, nickel oxide, copper oxide, gallium copper oxide, strontium copper oxide, niobium oxide, molybdenum oxide, indium copper oxide, indium silver oxide and iridium oxide.

In the case where the electron blocking layer is a single layer, the layer may be formed of an inorganic material, and in the case where the electron blocking layer is a multi-layer, one or more layers may be formed of an inorganic material.

The ionization potential (Ip) of the electron blocking layer is preferably 5.2 eV or more, more preferably 5.3 eV to 5.8 eV, and still more preferably 5.4 eV to 5.7 eV.

[Mixed Layer]

In the embodiment of the present invention, at least one charge blocking layer is provided between one of a pair of electrodes and the photoelectric conversion layer, and at least one layer of the electron blocking layer is a mixed layer containing fullerene or fullerene derivatives.

The mixed layer is a layer for improving heat resistance of the photoelectric conversion device. The mixed layer is a layer in which the material constituting the electron blocking layer is mixed with fullerene or fullerene derivatives. The mixed layer may be a layer in which the ratio of the organic material and fullerene or fullerene derivatives is constant, or a gradation layer in which the ratio varies along with the thickness direction of the film. In the case where there are a plurality of mixed layers, it is preferable that the content of fullerene or fullerene derivatives in the mixed layer is decreased as it gets closed to the electrode. It is possible to improve heat resistance of the photoelectric conversion device without decreasing the photoelectric conversion efficiency and light response speed of the photoelectric conversion device by inserting the mixed layer. A separate functional layer may be inserted between the photoelectric conversion layer and the mixed layer.

As one of the embodiments of the present invention, there may be the photoelectric conversion device in which a plurality of the electron blocking layers are provided, at least one layer of a plurality of the electron blocking layers is a layer containing fullerene or fullerene derivatives of 10% or less in volume ratio, and at least one layer of the plurality of the electron blocking layers is a mixed layer that contains a material other than the fullerene or fullerene derivatives contained in the layer containing fullerene or fullerene derivatives of 10% or less in volume ratio, and fullerene or fullerene derivatives. It is preferable that the layer in which the content of the fullerene or fullerene derivative has 10% or less in volume ratio is a layer in contact with the electrode.

In the layer containing fullerene or the fullerene derivatives of 10% or less in volume ratio, the content of the fullerene or fullerene derivative is preferably 0% to 5%, and more preferably 0% to 3%.

When at least one layer of a plurality of the electron blocking layers is the layer containing fullerene or fullerene derivatives of 10% or less in volume ratio and is the layer in contact with the electrode, it is possible to improve heat resistance of the photoelectric conversion device without decreasing the photoelectric conversion efficiency, light response speed and dark current characteristic of the photoelectric conversion device. In the case where the layer containing fullerene or fullerene derivatives of 10% or more in volume ratio is the layer in contact with the electrode, the function as the electron blocking layer for suppressing the electron injection from the electrode is deteriorated, but when the electron blocking layer in contact with the electrode contains fullerene or fullerene derivatives of 10% or less in volume ratio, the electron injection from the electrode may be efficiently suppressed.

It is preferable that the content of the fullerene or fullerene derivatives contained in the mixed layer is 30% to 70% in volume ratio. Heat resistance and the electric charge transporting property may be highly compatible by setting the content to the above volume ratio in this range. If the $C_{60}$ content of the fullerene or fullerene derivatives in the mixed layer is 70% or less, it is possible to obtain a sufficient hole transporting ability. In addition, if the $C_{60}$ content of the fullerene or fullerene derivatives in the mixed layer is 30% or more, it is possible to obtain a sufficient heat resistance improvement effect.

The film thickness of the mixed layer is preferably 5 nm or more, and more preferably 10 nm or more. If the film thickness of the mixed layer is 5 nm or more, the heat resistance may be effectively improved. In addition, the film thickness of the mixed layer is preferably 300 nm or less, more preferably 200 nm or less, and particularly preferably 100 nm or less.

It is preferable that the mixed layer that is at least one layer of the electron blocking layers is the layer in contact with the photoelectric conversion layer.

The mixed layer contains an organic compound having a glass transition temperature (Tg) of 200° C. or more, and preferably 210° C. or more. As Tg is increased, thermal stability of the film is preferably increased, but if the molecular weight is excessively increased in order to increase Tg, deposition stability is deteriorated. In order to sufficiently ensure the deposition stability, it is preferable that Tg is 350° C. or less.

(Organic Compound in which the Glass Transition Temperature is 200° C. or More)

As the material used in the electron blocking layer, the organic compound in which the glass transition temperature is 200° C. or more is preferable. The organic compound having the glass transition temperature of 200° C. or more is not particularly limited, but a compound having a large molecular size is preferable. In addition, the organic compound has preferably a branched-chained alkyl group, and more preferably a t-Bu group (tertiary butyl group). The organic compound may have a desired glass transition temperature by increasing the molecular size or having the substituent group having a large volume such as a branched-chained alkyl group.

As the organic compound in which the glass transition temperature is 200° C. or more, the compound in which the glass transition temperature is 200° C. or more and which is represented by the following General Formula (1-A1) or General Formula (1-A2) is preferable. Since the compound represented by General Formula (1-A1) or General Formula (1-A2) includes a carbazole structure or a fluorene structure, the molecular size is large and the glass transition temperature is high, such that if the compound is used in an intermediate layer, the photoelectric conversion device having excellent heat resistance may be manufactured.

It is preferable to use the compound represented by the following General Formula (1-A1) or General Formula (1-A2).

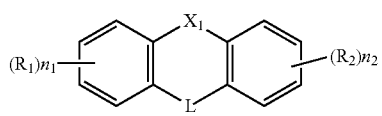

(1-A1)

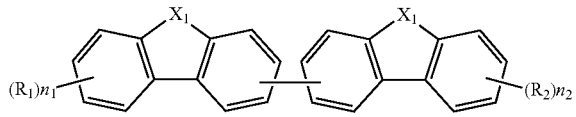

(1-A2)

Among General Formula (1-A1) and General Formula (1-A2), each of $R_1$ and $R_2$ independently represents a heterocyclic group that may be substituted by an alkyl group. Each of $X_1$ independently represents a carbon atom, a nitrogen atom, an oxygen atom, a sulfur atom, and a silicon atom, which may have a substituent group. L may represents a single bond, an oxygen atom, a sulfur atom, an alkylene group, an alkenylene group, a cycloalkylene group, a cycloalkenylene group, an arylene group, a divalent heterocyclic group or an imino group, which may have a substituent group. Each of $n_1$ and $n_2$ independently represents an integer of 1 to 4.

The heterocyclic group represented by $R_1$ or $R_2$ may include a condensed ring formed of 2 to 5 monocycles. In addition, the number of carbon atoms is preferably 6 to 30, and more preferably 6 to 20.

In addition, the alkyl group that may be substituted by the heterocyclic group is preferably an alkyl group having 1 to 6 carbon atoms, and may be a straight- or branched-chained alkyl group, or cyclic alkyl group (cycloalkyl group). In addition, a plurality of alkyl groups, together with each other, may form a ring (for example, a benzene ring), although a branched-chained alkyl group is preferable. In detail, the alkyl group may be a methyl group, an ethyl group, an iso-propyl group, a t-butyl group and a neopentyl group. A t-butyl group is preferable.

L represents a single bond, an oxygen atom, a sulfur atom, an alkylene group, an alkenylene group, a cycloalkylene group, a cycloalkenylene group, an arylene group, a divalent heterocyclic group or an imino group. L is preferably a single bond, an alkylene group having 1 to 12 carbon atoms, an alkenylene group having 2 to 12 carbon atoms (for example, —CH$_2$=CH$_2$—), an arylene group having 6 to 14 carbon atoms (for example, a 1,2-phenylene group, and a 2,3-naphthylene group), a heterocyclic group having 4 to 13 carbon atoms, an oxygen atom, a sulfur atom and an imino group (for example, a phenylimino group, a methylimino group, and a t-butylimino group) having a hydrocarbon group having 1 to 12 carbon atoms (preferably an aryl group or an alkyl group), more preferably a single bond, an alkylene group having 1 to 6 carbon atoms (for example, a methylene group, a 1,2-ethylene group, and a 1,1-dimethylmethylene group), an oxygen atom, a sulfur atom, and an imino group having 1 to 6 carbon atoms, and particularly preferably a single bond or an alkylene group having 1 to 6 carbon atoms.

In the case where L represents an alkylene group, an alkenylene group, a cycloalkylene group, a cycloalkenylene group, an arylene group, a divalent heterocyclic group or an imino group, they may have a substituent group. As more preferable substituent groups, there may be an alkyl group, a halogen atom, an aryl group and heterocyclic.

The heterocyclic group that may be substituted by the alkyl group represented by $R_1$ and $R_2$, may be the following N1 to N15. N13 is preferable.

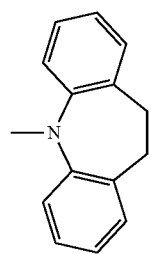

N13
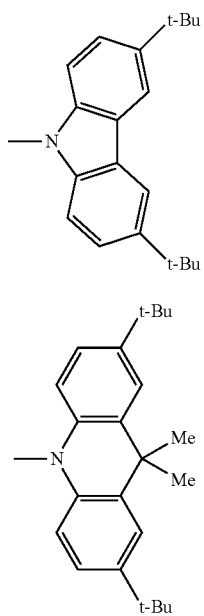

N14
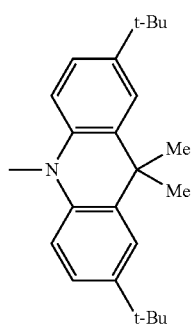

N15
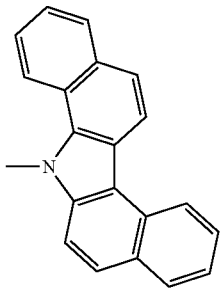

An alkyl group or an aryl group is preferable as the substituent group of $X_1$.

The alkyl group is preferably an alkyl group having 1 to 4 carbon atoms, for example, a methyl group, an ethyl group, a n-propyl group, an isopropyl group or a t-butyl group. A methyl group is more preferable.

The aryl group is preferably an aryl group having 6 to 20 carbon atoms. The aryl group may have an alkyl group, and is preferably an aryl group having 6 to 15 carbon atoms, which may have an alkyl group having 1 to 4 carbon atoms, for example, a phenyl group, a naphthyl group, an anthracenyl group, a 9-dimethylfluorenyl group, a methylphenyl group, and a dimethylphenyl group. A phenyl group, a naphthyl group, an anthracenyl group and a 9-dimethylfluorenyl group are preferable.

The following compounds are particularly preferable as the material of the electron blocking layer.

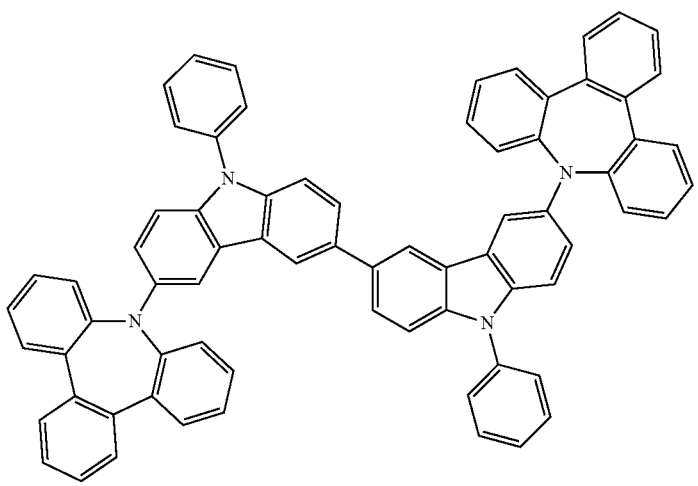

-continued
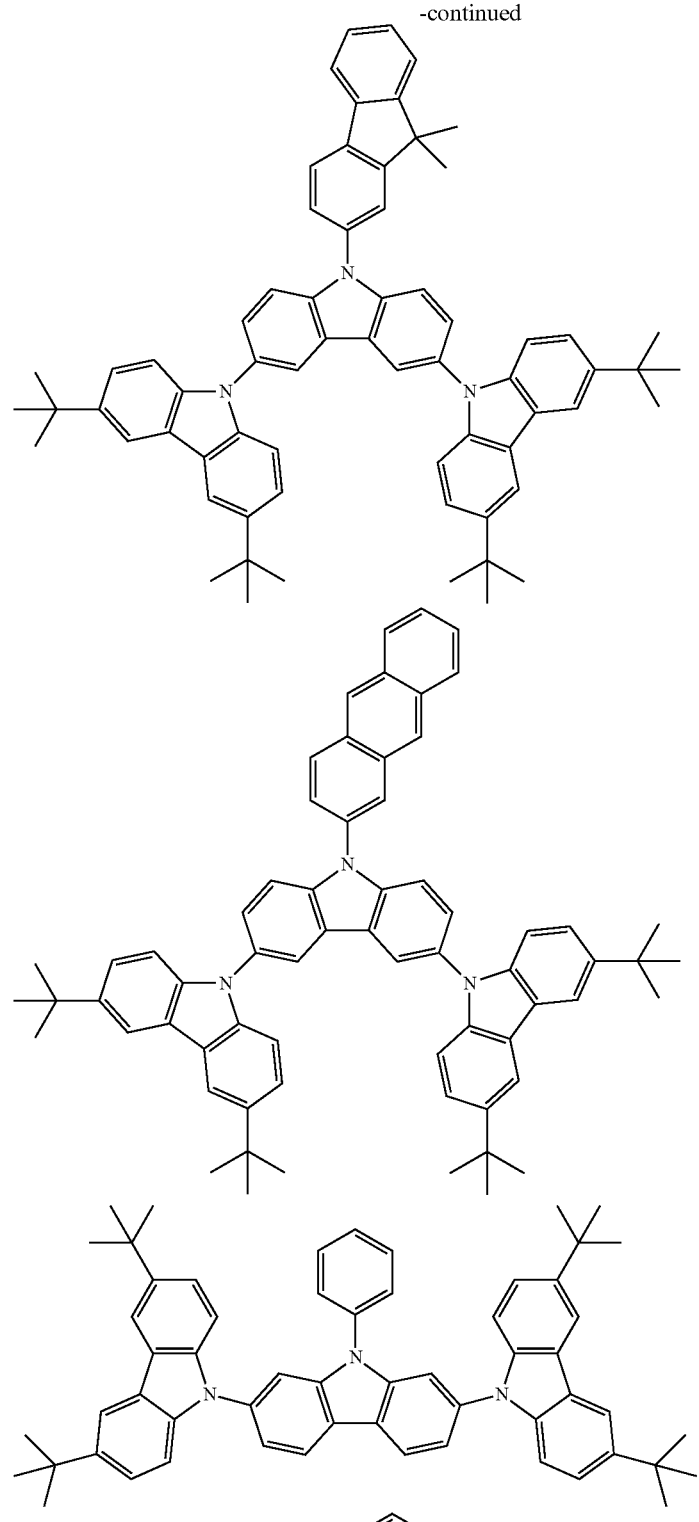

(Hole Blocking Layer)

An electron accepting organic material may be used in the hole blocking layer.

As the electron accepting material, an oxadiazole derivative such as 1,3-bis(4-tert-butylphenyl-1,3,4-oxadiazolyl) phenylene (OXD-7), an anthraquinodimethane derivative, a diphenylquinone derivative, bathocuproin and bathophenanthroline and a derivative thereof, a triazole compound, a tris(8-hydroxyquinolinate)aluminum complex, a bis(4-methyl-8-quinolinate)aluminum complex, a distyrylarylene derivative, and a sylol compound may be used. In addition, if a material has a sufficient electron transporting property, even though the material is not the electron accepting organic material, the material may be used. A porphyrin-based compound, a styryl-based compound such as DCM (4-dicyanomethylene-2-methyl-6-(4-(dimethylaminostyryl))-4H pyran) and a 4H pyran-based compound may be used. Specifically, the compounds disclosed in JP-A-2008-72090, paragraphs [0073] to [0078] are preferable.

[Photosensor]

The photoelectric conversion device may be largely categorized into a photocell and a photosensor, and the photoelectric conversion device according to the embodiment of the present invention is suitable for the photosensor. As the photosensor, the photoelectric conversion device may be used alone, or a line sensor in which the photoelectric conversion device is arranged in a straight line form or a two dimensional sensor in which the photoelectric conversion device is arranged in a plane may be used. The photoelectric conversion device according to the embodiment of the present invention, in a line sensor, converts light imaging information into an electric signal by using an optical system and a driving part such as in a scanner, and in a two-dimensional sensor, acts as an imaging device by imaging the light imaging information on the sensor using an optical system as in an imaging module and converting light imaging information into an electric signal.

Since a photocell is a power generation device, efficiency for converting light energy into electric energy is an important performance, and dark current that is current in a dark site is not considered as problematic in terms of a function. In addition, in installation of a color filter, a heating process at a rear end is not required. Since an important performance for the photosensor is conversion of a brightness signal into an electric signal with a high precision, efficiency for converting a light quantity into current is an important performance. However, if the signal is outputted from a dark site, the signal becomes a noise. Therefore, low dark current is required. In addition, resistance to the process at the rear end is also important.

[Imaging Device]

Subsequently, an embodiment of an imaging device having a photoelectric conversion device (10a) will be described. In the embodiments to be described below, like reference numerals designate like elements throughout the specification with respect to the member having the same configuration or operation as the previously described member, so that a description thereof is simplified or omitted.

The imaging device is a device for converting light information of an image into an electric signal, in which a plurality of photoelectric conversion devices are arranged on a matrix in the same plane, in each of the photoelectric conversion devices (pixel), the light signal is converted into the electric signal, and the electric signal per pixel is outputted sequentially to the outside of the imaging device. Accordingly, one pixel is constituted by one photoelectric conversion device and one or more transistors.

As one of the preferable embodiments of the imaging device, there may be a solid-state imaging device that includes the plurality of photoelectric conversion devices, a plurality of color filters installed above each of the photoelectric conversion devices, and a signal read-out portion that reads-out a signal according to an electric charge generated in the photoelectric conversion layer of the photoelectric conversion device.

Figure 2:
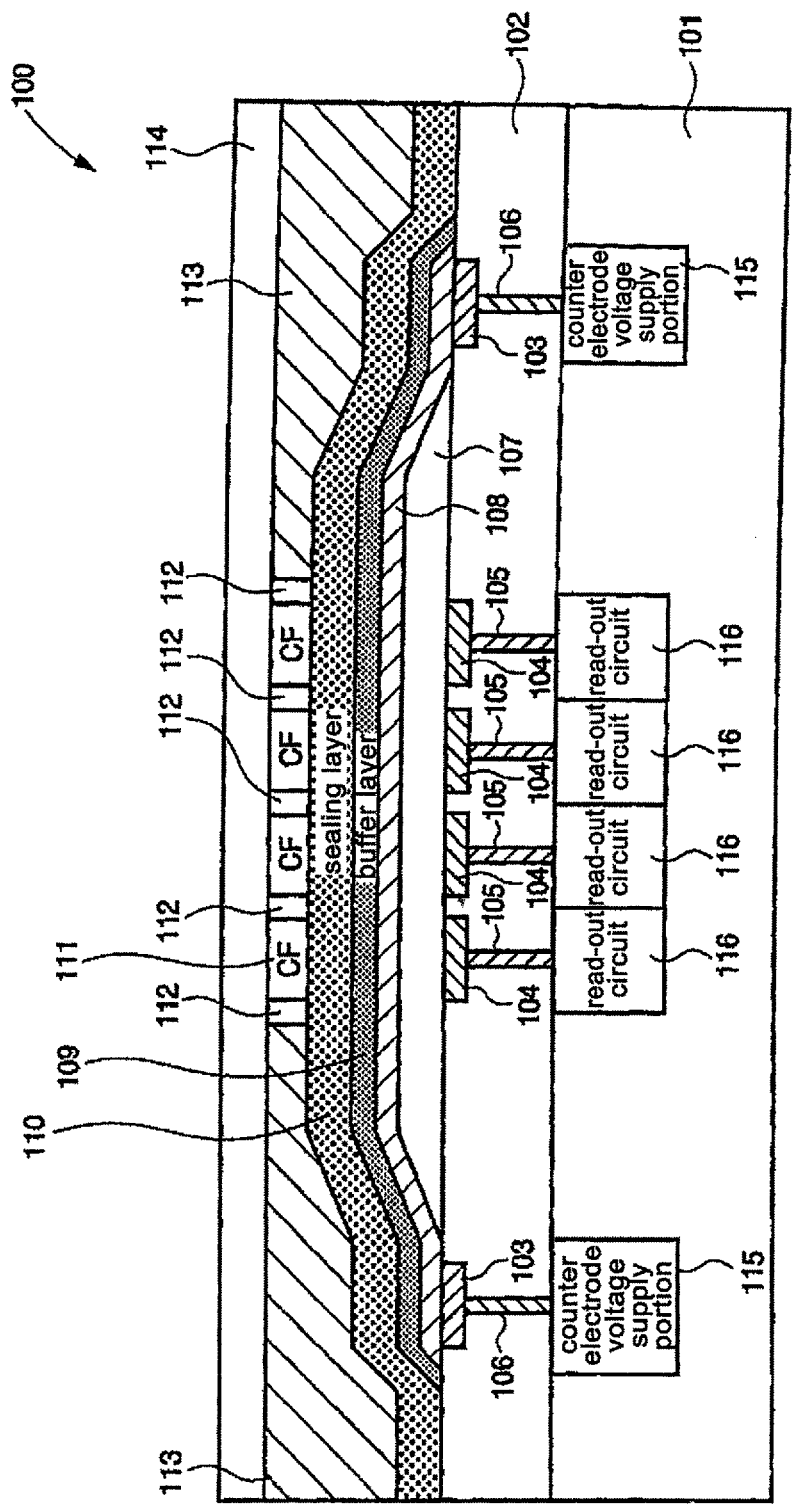
FIG. 2 illustrates a schematic cross-sectional view of an imaging device.

FIG. 2 is a schematic cross-sectional view illustrating a schematic configuration of an imaging device for describing an embodiment of the present invention. This imaging device is mounted and used in an imaging apparatus such as a digital camera, and a digital video camera, and an imaging module such as an electronic endoscope, and a mobile phone.

This imaging device has a plurality of photoelectric conversion devices as shown in FIG. 1, and a circuit substrate on which a read-out circuit that reads-out signal according to the electric charge generated in the photoelectric conversion layer of each of the photoelectric conversion devices is formed. And a plurality of photoelectric conversion devices are arranged in a one-dimensional or two-dimensional form on the same surface on an upper side of the circuit substrate.

An imaging device 100 shown in FIG. 2 includes a substrate 101, an insulating layer 102, a connection electrode 103, a pixel electrode (lower electrode) 104, a connection portion 105, a connection portion 106, a photoelectric conversion layer 107, a counter electrode (upper electrode) 108, a buffer layer 109, a sealing layer 110, a color filter (CF) 111, a partitioning wall 112, a light shielding layer 113, a protective layer 114, a counter electrode voltage supply portion 115, and a read-out circuit 116.

The pixel electrode 104 has the same function as the electrode 11 of the photoelectric conversion device 10a shown in FIG. 1. The counter electrode 108 has the same function as the electrode 15 of the photoelectric conversion device 10a shown in FIG. 1. The photoelectric conversion layer 107 has the same configuration as a layer formed between the electrode 11 and the electrode 15 of the photoelectric conversion device 10a shown in FIG. 1.

The substrate 101 is a glass substrate or a semiconductor substrate such as Si. The insulating layer 102 is formed on the substrate 101. A plurality of pixel electrodes 104 and connection electrodes 103 are formed on the surface of the insulating layer 102.

The photoelectric conversion layer 107 is formed by being covered on a plurality of pixel electrodes 104 and is a common layer to all of the elements located above the pixel electrodes 104 throughout the photoelectric conversion device.

The counter electrode 108 is installed on the photoelectric conversion layer 107 and is a common electrode to all of the elements located above the conversion 107 throughout the photoelectric conversion device. The counter electrode 108 is formed to reach above the connection electrode 103 disposed at the outer side than the photoelectric conversion layer 107, and electrically connected to the connection electrode 103.

The connection portion 106 is buried in the insulating layer 102, and functions as a plug for electrically connecting the connection electrode 103 and the counter electrode voltage supply portion 115. The counter electrode voltage supply portion 115 is formed on the substrate 101, and applies a predetermined voltage to the counter electrode 108 through the connection portion 106 and connection electrode 103. In the case where the voltage applied to the counter electrode 108 is higher than a power source voltage of the imaging device, the predetermined voltage is supplied by increasing a power source voltage by using a voltage increasing circuit such as a charge pump.

The read-out circuit 116 is installed on the substrate 101 to correspond to each of a plurality of pixel electrodes 104, and reads the signal according to the electric charge collected in the corresponding pixel electrode 104. The read-out circuit 116 is constituted by, for example, CCD, a CMOS circuit or a TFT circuit, and in which light is blocked by a light shielding layer disposed in the insulating layer 102 and not shown in the drawing. The read-out circuits 116 are electrically connected to the corresponding pixel electrode 104 through the corresponding connection portion 105.

The buffer layer 109 is formed on the counter electrode 108 with covering the counter electrode 108. The sealing layer 110 is formed on the buffer layer 109 with covering the buffer layer 109. The color filter 111 is formed at a position facing each of the pixel electrodes 104 on the sealing layer 110. The partitioning wall 112 is installed between the color filters 111, and improves light transmittance efficiency of the color filter 111.

The light shielding layer 113 is formed in a region other than a region in which the color filter 111 and the partitioning wall 112 are installed on the sealing layer 110, and prevents light from being incident to the photoelectric conversion layer 107 formed in a region other than an efficient pixel region. The protective layer 114 is formed on the color filter 111, the partitioning wall 112 and the light shielding layer 113, and protects the entire imaging device 100.

In the imaging device 100 constituted as described above, when light is incident, the light is incident to the photoelectric conversion layer 107, such that an electric charge is generated therefrom. The hole of the generated electric charge is collected in the pixel electrode 104, and the voltage signal according to the quantity thereof is outputted to the outside of the imaging device 100 by the read-out circuit 116.

The manufacturing method of the imaging device 100 is described below.

On the circuit substrate on which the counter electrode voltage supply portion 115 and the read-out circuit 116 are formed, the connection portions 105 and 106, the connection electrode 103, the plurality of pixel electrodes 104 and the insulating layer 102 are formed. The plurality of pixel electrodes 104 are arranged on the surface of the insulating layer 102, for example, in a square lattice form.

Subsequently, the photoelectric conversion layer 107 is formed on the plurality of pixel electrodes 104, for example, by using a vacuum heating deposition method. Subsequently, the counter electrode 108 is formed on the photoelectric conversion layer 107, for example, by using a sputter method under vacuum. Next, the buffer layer 109 and the sealing layer 110 are sequentially formed on the counter electrode 108, for example, by using the vacuum heating deposition method. Subsequently, after the color filter 111, the partitioning wall 112 and the light shielding layer 113 are formed, the protective layer 114 is formed, thereby completing the manufacturing of the imaging device 100.

In the manufacturing method of the imaging device 100, even though a process for putting the imaging device 100 under non-vacuum during the manufacturing is added between a process for forming the photoelectric conversion layer included in the photoelectric conversion layer 107 and a process for forming the sealing layer 110, performance deterioration of a plurality of photoelectric conversion devices can be prevented. The performance deterioration of the imaging device 100 may be prevented and a manufacturing cost may be suppressed by adding this process.

Hereinafter, details of the sealing layer 110 of configuration elements of the imaging device 100 described above will be described.

[Sealing Layer]

The following requirements are needed in the sealing layer 110.

First, in each manufacturing process of the device, the photoelectric conversion layer should be protected by preventing invasion of a factor degrading the organic photoelectric conversion material included in a solution and a plasma.

Second, after the device is manufactured, degradation of the photoelectric conversion layer 107 should be prevented during preservation and use for a long period of time by preventing invasion of the factor degrading the organic photoelectric conversion material such as water molecules.

Third, when the sealing layer 110 is formed, the previously formed photoelectric conversion layer should not be degraded.

Fourth, since incident light reaches the photoelectric conversion layer 107 through the sealing layer 110, the sealing layer 110 should be transparent with respect to light of a wavelength detected in the photoelectric conversion layer 107.

The sealing layer 110 may be constituted by a thin film made of a single material, but effects such as relieving of total stress of the sealing layer 110, suppression of generation of defects such as cracks and pinholes by occurrence of dust during the manufacturing process, and easy optimization of material development can be expected by constituting the sealing layer with a multilayered structure so that different functions are provided to each of the layers. For example, the sealing layer 110 may have a double layer structure in which a "sealing auxiliary layer" having a function that is difficult to be accomplished in a layer is laminated on the layer, which is used for the original purpose of preventing permeation of a degradation factor such as water molecules. A configuration of three or more layers can be feasible, but in consideration of the manufacturing cost, the small number of layers is more preferable.

[Formation of the Sealing Layer 110 by the Atomic Layer Deposition Method (ALD Method)]

The performance of the photoelectric conversion material is largely degraded due to the degradation factor such as water molecules. Accordingly, it is required to cover and seal the entire photoelectric conversion layer by dense ceramics such as metal oxide, metal nitride, and metal nitroxide or diamond type carbon (DLC) that is not allowed to permeate water molecules. In the related art, the sealing layer 110 may be formed by aluminum oxide, silicon oxide, silicon nitride, silicon nitroxide, a laminate configuration thereof, or a laminate configuration of these ceramics and an organic polymer using various vacuum film manufacturing technologies. However, in the known sealing layer, since it is difficult to grow a thin film in steps due to a structure on the surface of the substrate, fine defects on the surface of the substrate, and particles attached to the surface of the substrate (the step becomes a shadow), as compared to a flat portion, the film thickness is remarkably decreased. Accordingly, the step portion becomes a path through which the degradation factor invades. In order to completely cover the step by the sealing layer, it is preferable to make the entire sealing layer thick by manufacturing the film having the film thickness of 1 μm or more in the flat portion.

In the imaging device 100 in which a pixel dimension is less than 2 μm, and particularly about 1 μm, if a distance between the color filter 111 and the photoelectric conversion layer, that is, the film thickness of the sealing layer 110 is large, incident light is diffracted or diverged in the sealing layer 110, causing color mixing. Accordingly, it is preferable that the imaging device 100 in which the pixel dimension is about 1 μm is manufactured by using a sealing layer material/manufacturing method not degrading device performance even though the total film thickness of the sealing layer 110 is decreased.

The atomic layer deposition (ALD) method is a kind of CVD method and a technology for forming a thin film by alternately repeating adsorption/reaction of an organic metal compound molecule, a metal halogenated molecule, and a metal hydrogenated molecule that are a thin film material to the surface of the substrate, and decomposition of unreacted groups included therein. When the thin film material approaches the surface of the substrate, the film material is in a low molecular state. Therefore, if a very small space into which low molecules can enter exists, it is possible to grow the thin film. Accordingly, the step portion that is problematic in the known thin film forming method is completely covered (the thickness of the thin film grown in the step portion is the same as that of the thin film grown in the flat portion), such that a step covering property is very excellent. Accordingly, since the step caused by a structure on the surface of the substrate, fine defects on the surface of the substrate, and particles attached to the surface of the substrate may be completely covered, the step portion does not become an invasion path of the degradation factor of the photoelectric conversion material. In the case where the sealing layer 110 is formed by the atomic layer deposition method, the required film thickness of the sealing layer can be more efficiently decreased as compared to the known technology.

In the case where the sealing layer 110 is formed by the atomic layer deposition method, the material corresponding to the preferable ceramics appropriate for the sealing layer 110 may be selected. However, since the photoelectric conversion layer according to the embodiment of the present invention uses the photoelectric conversion material, the photoelectric conversion layer is limited to the material which can grow the thin film at a relatively low temperature at which the photoelectric conversion material is not degraded. By the atomic layer deposition method using alkylaluminum or halogenated aluminum as the material, the dense thin aluminum oxide film may be formed at a temperature of less than 200° C. at which the photoelectric conversion material is not degraded. Particularly, trimethylaluminum is preferably used since the thin aluminum oxide film may be formed at about 100° C. Silicon oxide or titanium oxide is also preferably used since the dense thin film may be formed at a temperature of less than 200° C. like aluminum oxide by appropriately selecting the material.

EXAMPLE

There is the photoelectric conversion device constituted by the lower electrode/the electron blocking layer 1/the electron blocking layer 2 (mixed layer)/the photoelectric conversion layer/the upper electrode/the sealing layer, which are sequentially formed. The electron blocking layer 1 is the electron blocking layer in which the content of a fullerene or a fullerene derivative is the volume ratio of 10% or less. The layer in which the electron blocking layer 1 and the mixed layer are mixed is the electron blocking layer. The electron blocking layer 1, the mixed layer, the photoelectric conversion layer, and the upper electrode were sequentially formed on the lower electrode. The lower electrode is TiN. The electron blocking layer 1 was formed in the film thickness of 60 nm by using the organic compound represented by compound 1 by the vacuum deposition method. In the mixed layer, the mixed layer of the organic compound represented by the compound 1 and $C_{60}$ (compound 1:$C_{60}$=1:2 (volume ratio)) was formed in the film thickness of 40 nm under vacuum by the co-deposition. The photoelectric conversion layer in which the compound 2 and fullerene ($C_{60}$) formed the bulk hetero structure was formed in the film thickness of 400 nm by forming the mixed layer (compound 2:$C_{60}$=1:2 (volume ratio)) of the organic compound represented by the compound 2 and $C_{60}$ under the vacuum by the co-deposition. The deposition of the organic compound was performed in the degree of vacuum of $5.0 \times 10^{-4}$ Pa or less at the deposition speed of 1 Å/s to 10 Å/s, thus forming the layer. The upper electrode was formed of ITO in the film thickness of 10 nm by the high frequency magnetron sputter. The sealing layer was formed of the laminate film of aluminum oxide and silicon nitride. Aluminum oxide was formed in the film thickness of 200 nm by using the atomic layer deposition apparatus. Silicon nitride was formed in the film thickness of 100 nm by using the magnetron sputter.

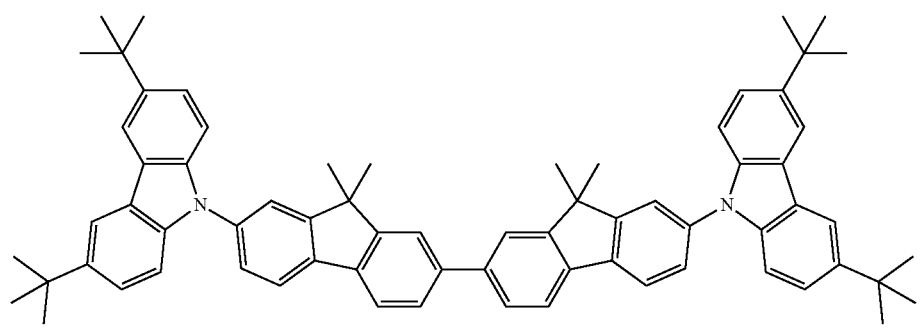

Compound 1

-continued

Compound 2

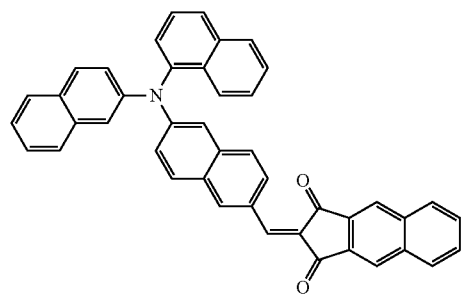

Compound 3

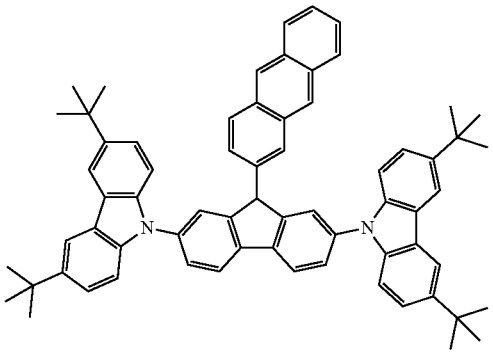

Compound 4

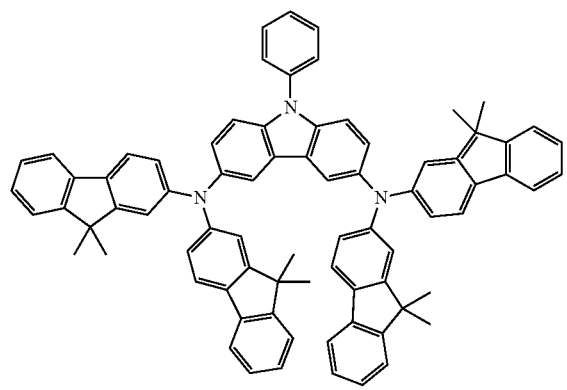

Compound 5

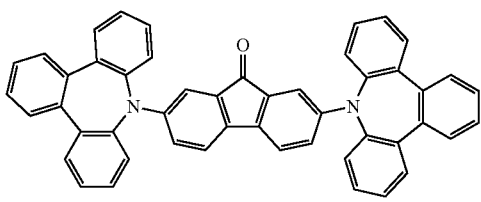

Compound 6

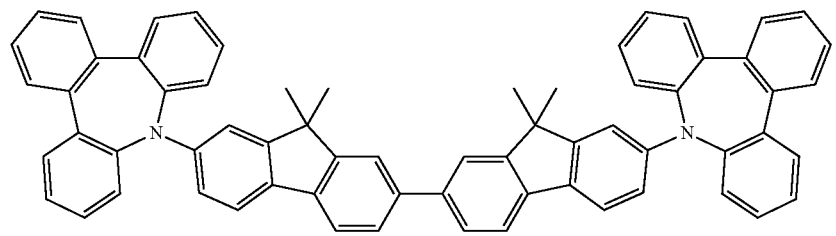

Compound 7

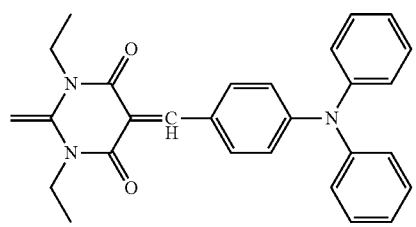

Compound 8

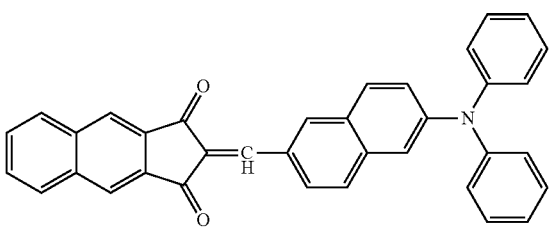

Examples 2 to 4, 6 to 8, 10 to 12, 14 to 16, 18 to 20, 22 to 31

As shown in Tables 3 to 16, the devices of Examples 2 to 4, 6 to 8, 10 to 12, 14 to 16, 18 to 20, and 22 to 31 were manufactured in the same manner as Example 1 by changing the materials of the electron blocking layer 1, the electron blocking layer 2 (mixed layer), and the photoelectric conversion layer (bulk hetero layer), and the mixing ratio and the film thickness of the materials.

Example 5

There is the photoelectric conversion device constituted by the lower electrode/electron blocking layer 2 (mixed layer)/the photoelectric conversion layer/the upper electrode/the sealing layer, which are sequentially formed. The electron blocking layer 2 (mixed layer), the photoelectric conversion layer, and the upper electrode are formed in this order. The lower electrode is TiN. In the mixed layer, the mixed layer of the organic compound represented by the compound 1 and $C_{60}$ (compound 1:$C_{60}$=1:1 (volume ratio)) was formed in the film thickness of 100 nm under the vacuum by the co-deposition. In the photoelectric conversion layer, the mixed layer of the organic compound represented by the compound 2 and $C_{60}$ (compound 2:$C_{60}$=1:2 (volume ratio)) was formed in the film thickness of 400 nm under the vacuum by the co-deposition. The upper electrode was formed of ITO in the film thickness of 10 nm by the high frequency magnetron sputter. The sealing layer was formed of the laminate film of aluminum oxide and silicon nitride. Aluminum oxide was formed in the film thickness of 200 nm by using the atomic layer deposition apparatus. Silicon nitride was formed in the film thickness of 100 nm by using the magnetron sputter.

Examples 9, 13, 17 and 21

As shown in Tables 4 to 7, the devices of Examples 9, 13, 17 and 21 were manufactured in the same manner as in Example 5 except for changing the materials of the electron blocking layer 2 (mixed layer), and the photoelectric conversion layer (bulk hetero layer), and the mixing ratio and the film thickness of the materials.

Example 32

The device of Example 32 was manufactured in the same manner as in Example 1, except that the layer was formed in the thickness of 60 nm under the vacuum by the co-deposition by changing the material of the electron blocking layer 1 in Example 1 into the mixed layer of the organic compound represented by the compound 1 and $C_{60}$ (compound 1:$C_{60}$=10:1 (volume ratio)).

Examples 33 and 34

As shown in Table 16, the devices of Examples 33, and 34 were manufactured in the same manner as in Example 32 except for changing the materials of the electron blocking layer 1, the electron blocking layer 2 (mixed layer), and the photoelectric conversion layer (bulk hetero layer), and the mixing ratio and the film thickness of the materials.

Comparative Examples 1 to 10

Comparative Example 1

The device of the comparative example 1 is the photoelectric conversion device constituted by the lower electrode/the electron blocking layer 1/the photoelectric conversion layer/the upper electrode/the sealing layer, which are sequentially formed. The electron blocking layer 1, the photoelectric conversion layer, and the upper electrode are formed in this order. The lower electrode is TiN. The electron blocking layer 1 was formed in the film thickness of 100 nm by using the organic compound represented by compound 1 by the vacuum deposition method. In the photoelectric conversion layer, the mixed layer of the organic compound represented by the compound 2 and $C_{60}$ (compound 2:$C_{60}$=1:2 (volume ratio)) was formed in the film thickness of 400 nm under the vacuum by the co-deposition. The upper electrode was formed of ITO in the film thickness of 10 nm by the high frequency magnetron sputter. The sealing layer was formed of the laminate film of aluminum oxide and silicon nitride. Aluminum oxide was formed in the film thickness of 200 nm by using the atomic layer deposition apparatus. Silicon nitride was formed in the film thickness of 100 nm by using the magnetron sputter.

As shown in Tables 4 to 15, the devices of Comparative Examples 2 to 10 were manufactured in the same manner as in Comparative Example 1 except for changing the materials of the electron blocking layer 1, the mixed layer, and the photoelectric conversion layer (bulk hetero layer), and the mixing ratio and the film thickness of the materials.

In the Tables, the portions in which the material and the film thickness of each of the layers are not represented means that the corresponding layer is not formed.

In Table 1, the ionization potentials of the electron blocking layer 1, and the electron blocking layer 2 (mixed layer) are described.

In Table 2, Tg of the material used in the electron blocking layers 1 and 2 is described.

TABLE 1

| Material | Ip (eV) |
| --- | --- |
| Compound 1 | 5.65 |
| Comp. 1:C60 (1:2) | 5.68 |
| Comp. 1:C60 (1:1) | 5.66 |
| Comp. 1:C60 (2:1) | 5.65 |
| Compound 3 | 5.45 |
| Comp. 3:C60 (1:2) | 5.51 |
| Comp. 3:C60 (1:1) | 5.49 |
| Comp. 3:C60 (2:1) | 5.47 |
| Compound 4 | 5.08 |
| Comp. 4:C60 (1:2) | 5.13 |
| Comp. 4:C60 (1:1) | 5.13 |
| Comp. 4:C60 (2:1) | 5.11 |
| Compound 5 | 5.06 |
| Comp. 5:C60 (1:2) | 5.12 |
| Comp. 5:C60 (1:1) | 5.11 |
| Comp. 5:C60 (2:1) | 5.08 |
| Compound 6 | 5.06 |
| Comp. 6:C60 (1:2) | 5.18 |
| Comp. 6:C60 (1:1) | 5.16 |
| Comp. 6:C60 (2:1) | 5.12 |

TABLE 2

| Material | Tg (° C.) |
| --- | --- |
| Compound 1 | 236 |
| Compound 3 | 220 |
| Compound 4 | 189 |
| Compound 5 | 196 |
| Compound 6 | 216 |

For the manufactured device, after the photoelectric conversion efficiency, dark current, and light response speed were measured, heat treatment was performed at each temperature disclosed in Tables 3 to 16 for 30 min, and then the photoelectric conversion efficiency, dark current, and light response speed were re-measured after the sample was restored to room temperature.

In Tables 3 to 16, the relative sensitivity, dark current, and light response speed in a state in which a plus bias of 2.0 E+5 V/cm was applied to the upper electrode of the manufactured device before the heat treatment, the heat treatment temperature of the device, and whether the performance deterioration after the heat treatment is occurred or not are described. The light response speed represents a time until the photocurrent is increased to 99% after light is incident to the photoelectric conversion device. In the case where the change of sensitivity was 1% or more, it was evaluated that the sensitivity was degraded, in the case where the increase of the dark current was 100 pA/cm² or more, it was evaluated that the dark current was increased, and in the case where the response speed was delayed by 10 μs or more, it was evaluated that the response speed was degraded.

TABLE 3

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 1 | Compound 1 | 60 | Compound 1:C60 (1:2) | 40 | Compound 2:C60 (1:2) | 400 |
| Example 2 | Compound 1 | 60 | Compound 1:C60 (1:1) | 40 | Compound 2:C60 (1:2) | 400 |
| Example 3 | Compound 1 | 60 | Compound 1:C60 (2:1) | 40 | Compound 2:C60 (1:2) | 400 |
| Example 4 | Compound 1 | 80 | Compound 1:C60 (1:2) | 20 | Compound 2:C60 (1:2) | 400 |
| Example 5 | | | Compound 1:C60 (1:1) | 100 | Compound 2:C60 (1:2) | 400 |
| Comparative Example 1 | Compound 1 | 100 | | | Compound 2:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 210° C., 30 mins | 220° C., 30 mins | 230° C., 30 mins |
| Example 1 | 1 | 8.4E−11 | 10 | No deterioration | No deterioration | No deterioration |
| Example 2 | 1 | 8.1E−11 | 10 | No deterioration | No deterioration | No deterioration |
| Example 3 | 1 | 8.8E−11 | 10 | No deterioration | No deterioration | No deterioration |
| Example 4 | 1 | 8.3E−11 | 10 | No deterioration | No deterioration | No deterioration |
| Example 5 | 1 | 8.4E−08 | 10 | No deterioration | No deterioration | No deterioration |
| Comparative Example 1 | 1 | 9.1E−11 | 10 | No deterioration | Deterioration in response speed | Increase in dark current, deterioration in response speed |

TABLE 4

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 6 | Compound 3 | 60 | Compound 3:C60 (1:2) | 40 | Compound 2:C60 (1:2) | 400 |
| Example 7 | Compound 3 | 60 | Compound 3:C60 (1:1) | 40 | Compound 2:C60 (1:2) | 400 |
| Example 8 | Compound 3 | 60 | Compound 3:C60 (2:1) | 40 | Compound 2:C60 (1:2) | 400 |
| Example 9 | | | Compound 3:C60 (1:1) | 100 | Compound 2:C60 (1:2) | 400 |
| Comparative Example 2 | Compound 3 | 100 | | | Compound 2:C60 (1:2) | 400 |

| | Device Performance before heat treatment | | | Device Performance after heat treatment | | |
|---|---|---|---|---|---|---|
| | Relative | current | speed | 210° C., | 220° C., | 230° C., |

TABLE 4-continued

|  | Sensitivity | (A/cm²) | (μs) | 30 mins | 30 mins | 30 mins |
|---|---|---|---|---|---|---|
| Example 6 | 1 | 9.8E−11 | 10 | No deterioration | No deterioration | No deterioration |
| Example 7 | 1 | 9.2E−11 | 10 | No deterioration | No deterioration | No deterioration |
| Example 8 | 1 | 9.3E−11 | 10 | No deterioration | No deterioration | No deterioration |
| Example 9 | 1 | 8.9E−08 | 10 | No deterioration | No deterioration | No deterioration |
| Comparative Example 2 | 1 | 9.6E−11 | 10 | No deterioration | Deterioration in response speed | Increase in dark current, deterioration in response speed |

TABLE 5

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 10 | Compound 4 | 60 | Compound 4:C60 (1:2) | 40 | Compound 2:C60 (1:2) | 400 |
| Example 11 | Compound 4 | 60 | Compound 4:C60 (1:1) | 40 | Compound 2:C60 (1:2) | 400 |
| Example 12 | Compound 4 | 60 | Compound 4:C60 (2:1) | 40 | Compound 2:C60 (1:2) | 400 |
| Example 13 | | | Compound 4:C60 (1:1) | 100 | Compound 2:C60 (1:2) | 400 |
| Comparative Example 3 | Compound 4 | 100 | | | Compound 2:C60 (1:2) | 400 |

| | Device Performance before heat treatment | | | Device Performance after heat treatment | | |
|---|---|---|---|---|---|---|
| | Relative Sensitivity | Dark current (A/cm²) | Response speed (μs) | 190° C., 30 mins | 200° C., 30 mins | 210° C., 30 mins |
| Example 10 | 1 | 8.6E−10 | 10 | No deterioration | No deterioration | Increase in dark current |
| Example 11 | 1 | 8.4E−10 | 10 | No deterioration | No deterioration | Increase in dark current |
| Example 12 | 1 | 7.2E−10 | 10 | No deterioration | No deterioration | Increase in dark current |
| Example 13 | 1 | 9.8E−08 | 10 | No deterioration | No deterioration | Increase in dark current |
| Comparative Example 3 | 1 | 6.1E−10 | 10 | No deterioration | Increase in dark current | Increase in dark current, deterioration in response speed |

TABLE 6

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |

TABLE 6-continued

| | | | | | | |
|---|---|---|---|---|---|---|
| Example 14 | Compound 5 | 60 | Compound 5:C60 (1:2) | 40 | Compound 2:C60 (1:2) | 400 |
| Example 15 | Compound 5 | 60 | Compound 5:C60 (1:1) | 40 | Compound 2:C60 (1:2) | 400 |
| Example 16 | Compound 5 | 60 | Compound 5:C60 (2:1) | 40 | Compound 2:C60 (1:2) | 400 |
| Example 17 | | | Compound 5:C60 (1:1) | 100 | Compound 2:C60 (1:2) | 400 |
| Comparative Example 4 | Compound 5 | 100 | | | Compound 2:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 190° C., 30 mins | 200° C., 30 mins | 210° C., 30 mins |
| Example 14 | 1 | 9.1E−10 | 10 | No deterioration | No deterioration | Increase in dark current |
| Example 15 | 1 | 9.2E−10 | 10 | No deterioration | No deterioration | Increase in dark current |
| Example 16 | 1 | 9.2E−10 | 10 | No deterioration | No deterioration | Increase in dark current |
| Example 17 | 1 | 9.7E−08 | 10 | No deterioration | No deterioration | Increase in dark current |
| Comparative Example 4 | 1 | 8.8E−10 | 10 | No deterioration | Increase in dark current | Increase in dark current, deterioration in response speed |

TABLE 7

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 18 | Compound 6 | 60 | Compound 6:C60 (1:2) | 40 | Compound 2:C60 (1:2) | 400 |
| Example 19 | Compound 6 | 60 | Compound 6:C60 (1:1) | 40 | Compound 2:C60 (1:2) | 400 |
| Example 20 | Compound 6 | 60 | Compound 6:C60 (2:1) | 40 | Compound 2:C60 (1:2) | 400 |
| Example 21 | | | Compound 6:C60 (1:1) | 100 | Compound 2:C60 (1:2) | 400 |
| Comparative Example 5 | Compound 6 | 100 | | | Compound 2:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 210° C., 30 mins | 220° C., 30 mins | 230° C., 30 mins |
| Example 18 | 1 | 9.1E−10 | 10 | No deterioration | No deterioration | No deterioration |
| Example 19 | 1 | 9.2E−10 | 10 | No deterioration | No deterioration | No deterioration |
| Example 20 | 1 | 9.2E−10 | 10 | No deterioration | No deterioration | No deterioration |
| Example 21 | 1 | 9.7E−08 | 10 | No deterioration | No deterioration | No deterioration |
| Comparative Example 5 | 1 | 8.8E−10 | 10 | No deterioration | Deterioration in response speed | Increase in dark current, deterioration in response speed |

TABLE 8

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 2 | Compound 1 | 60 | Compound 1:C60 (1:1) | 40 | Compound 2:C60 (1:2) | 400 |
| Comparative Example 1 | Compound 1 | 100 | | | Compound 2:C60 (1:2) | 400 |

| | Device Performance before heat treatment | | Device Performance after heat treatment | | |
|---|---|---|---|---|---|
| | Relative Sensitivity | Dark current (A/cm$^2$) | Response speed (µs) | 210° C., 30 mins | 220° C., 30 mins | 230° C., 30 mins |
| Example 2 | 1 | 8.1E−11 | 10 | No deterioration | No deterioration | No deterioration |
| Comparative Example 1 | 1 | 9.1E−11 | 10 | No deterioration | Deterioration in response speed | Increase in dark current, deterioration in response speed |

TABLE 9

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 22 | Compound 1 | 60 | Compound 1:C60 (1:1) | 40 | Compound 2:C60 (1:1) | 400 |
| Comparative Example 6 | Compound 1 | 100 | | | Compound 2:C60 (1:1) | 400 |

| | Device Performance before heat treatment | | Device Performance after heat treatment | | |
|---|---|---|---|---|---|
| | Relative Sensitivity | Dark current (A/cm$^2$) | Response speed (µs) | 210° C., 30 mins | 220° C., 30 mins | 230° C., 30 mins |
| Example 22 | 1 | 9.7E−11 | 10 | No deterioration | No deterioration | No deterioration |
| Comparative Example 6 | 1 | 9.4E−11 | 10 | No deterioration | Deterioration in response speed | Increase in dark current, deterioration in response speed |

TABLE 10

| | Electron blocking layer 1 | Electron blocking layer 2 (Mixed layer) | Photoelectric Conversion layer (Bulk hetero layer) |
|---|---|---|---|
| | Film | | Film |

TABLE 10-continued

| | Material | Thickness (nm) | Material | Film Thickness (nm) | Material | Thickness (nm) |
|---|---|---|---|---|---|---|
| Example 23 | Compound 1 | 60 | Compound 1:C60 (1:1) | 40 | Compound 2:C60 (2:1) | 400 |
| Comparative Example 7 | Compound 1 | 100 | | | Compound 2:C60 (2:1) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 200° C., 30 mins | 210° C., 30 mins | 220° C., 30 mins |
| Example 23 | 1 | 8.9E−11 | 600 | No deterioration | No deterioration | Increase in dark current |
| Comparative Example 7 | 1 | 9.2E−11 | 600 | No deterioration | Increase in dark current, deterioration in response speed | Increase in dark current, deterioration in response speed |

TABLE 11

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 24 | Compound 1 | 60 | Compound 1:C60 (1:1) | 40 | Compound 2:C60 (1:5) | 400 |
| Comparative Example 8 | Compound 1 | 100 | | | Compound 2:C60 (1:5) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 210° C., 30 mins | 220° C., 30 mins | 230° C., 30 mins |
| Example 24 | 1 | 8.4E−11 | 350 | No deterioration | No deterioration | No deterioration |
| Comparative Example 8 | 1 | 8.8E−11 | 350 | No deterioration | Deterioration in response speed | Increase in dark current, deterioration in response speed |

TABLE 12

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 2 | Compound 1 | 60 | Compound 1:C60 (1:1) | 40 | Compound 2:C60 (1:2) | 400 |

TABLE 12-continued

| | | | | | | |
|---|---|---|---|---|---|---|
| Example 25 | Compound 1 | 75 | Compound 1:C60 (1:1) | 25 | Compound 2:C60 (1:2) | 400 |
| Example 26 | Compound 1 | 92 | Compound 1:C60 (1:1) | 8 | Compound 2:C60 (1:2) | 400 |
| Example 27 | Compound 1 | 97 | Compound 1:C60 (1:1) | 3 | Compound 2:C60 (1:2) | 400 |
| Comparative Example 1 | Compound 1 | 100 | | | Compound 2:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 220° C., 30 mins | 225° C., 30 mins | 230° C., 30 mins |
| Example 2 | 1 | 8.1E−11 | 10 | No deterioration | No deterioration | No deterioration |
| Example 25 | 1 | 8.8E−11 | 10 | No deterioration | No deterioration | No deterioration |
| Example 26 | 1 | 8.6E−11 | 10 | No deterioration | No deterioration | Deterioration in response speed |
| Example 27 | 1 | 8.7E−11 | 10 | No deterioration | Deterioration in response speed | Increase in dark current |
| Comparative Example 1 | 1 | 9.1E−11 | 10 | Deterioration in response speed | Increase in dark current, deterioration in response speed | Increase in dark current, deterioration in response speed |

TABLE 13

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 25 | Compound 1 | 75 | Compound 1:C60 (1:1) | 25 | Compound 2:C60 (1:2) | 400 |
| Example 28 | Compound 1 | 15 | Compound 1:C60 (1:1) | 10 | Compound 2:C60 (1:2) | 400 |
| Example 29 | Compound 1 | 5 | Compound 1:C60 (1:1) | 10 | Compound 2:C60 (1:2) | 400 |
| Comparative Example 1 | Compound 1 | 100 | | | Compound 2:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 220° C., 30 mins | 225° C., 30 mins | 230° C., 30 mins |
| Example 25 | 1 | 8.8E−11 | 10 | No deterioration | No deterioration | No deterioration |
| Example 28 | 1 | 9.8E−11 | 10 | No deterioration | No deterioration | No deterioration |
| Example 29 | 1 | 7.2E−10 | 10 | No deterioration | Increase in dark current | Increase in dark current |
| Comparative Example 1 | 1 | 9.1E−11 | 10 | Deterioration in response speed | Increase in dark current, deterioration in response speed | Increase in dark current, deterioration in response speed |

TABLE 14

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 30 | Compound 4 | 60 | Compound 4:C60 (1:1) | 40 | Compound 7:C60 (1:2) | 400 |
| Comparative Example 9 | Compound 4 | 100 | | | Compound 7:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 180° C., 30 mins | 190° C., 30 mins | 200° C., 30 mins |
| Example 30 | 1 | 7.1E−10 | 30 | No deterioration | No deterioration | No deterioration |
| Comparative Example 9 | 1 | 8.3E−10 | 30 | No deterioration | Increase in dark current, deterioration in response speed | Increase in dark current, deterioration in response speed |

TABLE 15

| | Electron blocking layer 1 | | Electron blocking layer 2 (Mixed layer) | | Photoelectric Conversion layer (Bulk hetero layer) | |
|---|---|---|---|---|---|---|
| | Material | Film Thickness (nm) | Material | Film Thickness (nm) | Material | Film Thickness (nm) |
| Example 31 | Compound 3 | 60 | Compound 3:C60 (1:1) | 40 | Compound 8:C60 (1:2) | 400 |
| Comparative Example 10 | Compound 3 | 100 | | | Compound 8:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 190° C., 30 mins | 200° C., 30 mins | 210° C., 30 mins |
| Example 31 | 1 | 8.5E−11 | 15 | No deterioration | No deterioration | No deterioration |
| Comparative Example 10 | 1 | 8.7E−11 | 15 | No deterioration | Increase in dark current, deterioration in response speed | Increase in dark current, deterioration in response speed |

TABLE 16

| Electron blocking layer 1 | Electron blocking layer 2 | Photoelectric Conversion layer (Bulk hetero layer) |
|---|---|---|

TABLE 16-continued

| | Film | | (Mixed layer) | | Film | |
|---|---|---|---|---|---|---|
| | Material | Thickness (nm) | Material | Film Thickness (nm) | Material | Thickness (nm) |
| Example 1 | Compound 1 | 60 | Compound 1:C60 (1:2) | 40 | Compound 2:C60 (1:2) | 400 |
| Example 32 | Compound 1:C60 (10:1) | 60 | Compound 1:C60 (1:2) | 40 | Compound 2:C60 (1:2) | 400 |
| Example 33 | Compound 1:C60 (20:1) | 60 | Compound 1:C60 (1:2) | 40 | Compound 2:C60 (1:2) | 400 |
| Example 34 | Compound 1:C60 (35:1) | 60 | Compound 1:C60 (1:2) | 40 | Compound 2:C60 (1:2) | 400 |

| | Device Performance before heat treatment | | | Device Performance after heat treatment | | |
|---|---|---|---|---|---|---|
| | Relative Sensitivity | Dark current (A/cm$^2$) | Response speed (μs) | 210° C., 30 mins | 220° C., 30 mins | 230° C., 30 mins |
| Example 1 | 1 | 8.4E−11 | 10 | No deterioration | No deterioration | No deterioration |
| Example 32 | 1 | 9.3E−10 | 10 | No deterioration | No deterioration | No deterioration |
| Example 33 | 1 | 1.8E−10 | 10 | No deterioration | No deterioration | No deterioration |
| Example 34 | 1 | 8.5E−11 | 10 | No deterioration | No deterioration | No deterioration |

When Examples 1 to 5 are compared with Comparative Example 1 in which the compound 1 is used in the electron blocking layer 1 and the electron blocking layer 2 (mixed layer) is not used, there is no change in sensitivity and response speed before the heat treatment in Examples 1 to 5. As a result of evaluating performance after the heat treatment, in Comparative Example 1, performance was degraded by the heat treatment at 220° C. for 30 min, but in Examples 1 to 5, the performance deterioration did not occur even after the heat treatment at 230° C. for 30 min. In addition, in Examples 1 to 4 in which the electron blocking layer 1 in contact with the electrode is formed to contain fullerene or fullerene derivatives of 10% or less in volume ratio, as compared to Example 5 in which the electron blocking layer 1 was not formed, the dark current was largely suppressed before the heat treatment. This is because the electrons could be prevented from being injected from the lower electrode to the photoelectric conversion device by installing the electron blocking layer 1.

When Examples 6 to 9 are compared with Comparative Example 2 in which the compound 3 is used in the electron blocking layer 1 and the mixed layer is not used, there is no change in sensitivity and response speed before the heat treatment in Examples 6 to 9. As a result of evaluating performance after the heat treatment, in Comparative Example 2, performance was degraded by the heat treatment at 220° C. for 30 min, but in Examples 6 to 9, the performance deterioration did not occur even after the heat treatment at 230° C. for 30 min. In addition, in Examples 6 to 8 in which the electron blocking layer 1 in contact with the electrode is formed to contain fullerene or fullerene derivatives of 10% or less in volume ratio, as compared to Example 9 in which the electron blocking layer 1 was not installed, the dark current was largely suppressed before the heat treatment.

When Examples 10 to 13 are Comparative Example 3 in which the compound 4 is used in the electron blocking layer 1 and the mixed layer is not used, there is no change in sensitivity and response speed before the heat treatment in Examples 10 to 13. As a result of evaluating performance after the heat treatment, in Comparative Example 3, performance was degraded by the heat treatment at 200° C. for 30 min, but in Examples 10 to 13, the performance deterioration did not occur even after the heat treatment at 200° C. for 30 min. In addition, in Examples 10 to 12 in which the electron blocking layer 1 in contact with the electrode is formed to contain fullerene or fullerene derivatives of 10% or less in volume ratio, as compared to Example 13 in which the electron blocking layer 1 was not installed, the dark current was largely suppressed before the heat treatment.

When Examples 14 to 17 are compared with Comparative Example 4 in which the compound 5 is used in the electron blocking layer 1 and the mixed layer is not used, there is no change in sensitivity and response speed before the heat treatment in Examples 14 to 17. As a result of evaluating performance after the heat treatment, in Comparative Example 4, performance was degraded by the heat treatment at 200° C. for 30 min, but in Examples 14 to 17, the performance deterioration did not occur even after the heat treatment at 200° C. for 30 min. In addition, in Examples 14 to 16 in which the electron blocking layer 1 in contact with the electrode is formed to contain fullerene or fullerene derivatives of 10% or less in volume ratio, as compared to Example 17 in which the electron blocking layer 1 was not installed, the dark current was largely suppressed before the heat treatment.

When Examples 18 to 21 are compared with Comparative Example 5 in which the compound 6 is used in the electron blocking layer 1 and the mixed layer is not used, there is no change in sensitivity and response speed before the heat treatment in Examples 18 to 21. If the heat treatment was performed, in Comparative Example 5, performance was degraded by the heat treatment at 220° C. for 30 min, but in Examples 18 to 21, the performance deterioration did not occur even after the heat treatment at 230° C. for 30 min. In addition, in Examples 18 to 20 in which the electron blocking layer 1 in contact with the electrode is formed to contain fullerene or fullerene derivatives of 10% or less in volume ratio, as compared to Example 21 in which the electron blocking layer 1 was not installed, the dark current was largely suppressed before the heat treatment.

In Examples 1 to 9, and 18 to 21 in which the materials having Tg of 200° C. or more were used in the electron blocking layer, the performance deterioration did not occur even in the heat treatment at 230° C. for 30 min, and an extremely high heat resistance was achieved.

In Examples 1 to 4 and Examples 6 to 8 in which the electron blocking layer 1 and the electron blocking layer 2 having the ionization potential of 5.2 eV or more are used, an extremely low dark current of 100 $pA/cm^2$ or less was achieved. In the case where fullerene is in contact with the material used in the electron blocking layer, if the energy gap between HOMO of the electron blocking layer and LUMO of the fullerene is small, the thermal excited carrier is generated between HOMO of the electron blocking layer and LUMO of the fullerene, thereby causing the dark current. The generation of the thermal excited carrier could be suppressed by setting the HOMO energy level of the electron blocking layer to 5.2 eV or more.

In Table 8, when Example 2 is compared with Comparative Example 1, heat resistance was improved by using the mixed layer. In Table 9, when Example 22 is compared with Comparative Example 6, heat resistance was improved by using the mixed layer. In Table 10, when Example 23 is compared with Comparative Example 7, heat resistance was improved by using the mixed layer. In Table 11, when Example 24 is compared with Comparative Example 8, heat resistance was improved by using the mixed layer. Accordingly, even though the ratio of the fullerene of the bulk hetero layer is changed, it can be seen that the heat resistance was improved by introducing the mixed layer. In addition, when Examples 2, 22, 23 and 24 are compared with each other, in Examples 2 and 22 in which the ratio of the fullerene of the bulk hetero layer is in the range of 40% to 80%, the high efficiency, low dark current, high speed response, and high heat resistance are all satisfied. In Example 23 in which the ratio of the fullerene of the bulk hetero layer was smaller than 40%, the response speed and heat resistance were decreased. In Example 24 in which the ratio of the fullerene of the bulk hetero layer was larger than 80%, the response speed was decreased.

When Examples 2, and 25 to 27 are compared with Comparative Example 1, heat resistance was improved by introducing the mixed layer regardless of the film thickness of the mixed layer. When Example 26 is compared with Example 27, heat resistance was improved in Example 26 in which the film thickness of the mixed layer was 5 nm or more. When Example 2, Example 25, and Example 26 are compared, in Examples 2 and 25 in which the film thickness of the mixed layer was 10 nm or more, heat resistance was improved.

When Examples 25, 28, and 29 are compared with Comparative Example 1, heat resistance was improved by introducing the mixed layer regardless of the film thickness of the electron blocking layer (the sum of the film thickness of the electron blocking layer 1 and the film thickness of the mixed layer). When Example 25, 28 and 29 are compared, in Examples 25 and 28 in which the film thickness of the electron blocking layer was 20 nm or more, since the dark current was low, so that heat resistance was improved.

When Example 30 is compared with Comparative Example 9, heat resistance was improved by introducing the mixed layer. In comparing Example 31 and Comparative Example 10, heat resistance was improved by introducing the mixed layer. Accordingly, it can be seen that even though the material of the photoelectric conversion layer was changed, heat resistance was improved.

When Examples 1, 32, 33 and 34 are compared with each other, there is no change in sensitivity, response speed, and heat resistance. In addition, since the content of the fullerene or fullerene derivative of the electron blocking layer in contact with the electrode was 10% or less, the sufficient low dark current was implemented. In addition, in Examples 1, 33 and 34 in which the content of the fullerene or fullerene derivative of the electron blocking layer in contact with the electrode was 5% or less, the dark current lower than that of Example 32 was implemented. In addition, in Examples 1 and 34 in which the content of the fullerene or fullerene derivative of the electron blocking layer in contact with the electrode was 3% or less, the dark current lower than that of Example 33 was implemented.

Accordingly, it was proved that heat resistance was improved by providing the electron blocking layer between the electrode and the photoelectric conversion layer, and forming the first mixed layer in which the organic compound material and fullerene were mixed as the electron blocking layer.

Further, it was proved that heat resistance was improved without degrading the photoelectric conversion efficiency, dark current, and response speed by forming the electron blocking layer between the electrode and photoelectric conversion layer, forming the first mixed layer in which the organic compound material and fullerene were mixed as at least one layer of the electron blocking layers, making the electron blocking layer in contact with the electrode to contain an organic compound material other than fullerene included in the mixed layer, and setting the volume ratio of the fullerene of the electron blocking layer in contact with the electrode to 10% or less.

While the present invention has been shown and described with reference to certain exemplary embodiments thereof, it will be understood by those skilled in the art that various changes modifications may be made therein without departing from the spirit and scope of the present invention as defined by the appended claims.

What is claimed is:

1. A photoelectric conversion device comprising:
   a pair of electrodes;
   a photoelectric conversion layer sandwiched between the pair of electrodes; and
   at least one electron blocking layer provided between one electrode of the pair of electrodes and the photoelectric conversion layer,
   wherein the photoelectric conversion layer contains at least one organic material, and
   the at least one electron blocking layer has a mixed layer containing fullerene or fullerene derivatives.

2. The photoelectric conversion device according to claim 1,
   wherein a thickness of the electron blocking layer is 20 nm or more.

3. The photoelectric conversion device according to claim 1,
   wherein an ionization potential (Ip) of the electron blocking layer is 5.2 eV or more.

4. The photoelectric conversion device according to claim 1,
   wherein a thickness of the mixed layer is 5 nm or more.

5. The photoelectric conversion device according to claim 1,
   wherein the thickness of the mixed layer is 10 nm or more.

6. The photoelectric conversion device according to claim 1,
   wherein the mixed layer contains an organic compound having glass-transition temperature of 200° C. or more.

7. A solid-state imaging device comprising:

the plurality of photoelectric conversion devices according to claim 1;

a plurality of color filters provided on each of the photoelectric conversion devices; and a signal read-out portion that reads-out a signal according to an electric charge generated in the photoelectric conversion layers of the photoelectric conversion devices.

8. The photoelectric conversion device of claim 1, wherein the electron blocking layer is formed with a plurality layers, the plurality layers comprise:

a layer containing the fullerene or fullerene derivatives of 10% or less in volume ratio, and the mixed layer containing:

a material other than the fullerene or fullerene derivative contained in the layer containing the fullerene or fullerene derivatives of 10% or less in volume ratio; and the fullerene or fullerene derivatives.

9. The photoelectric conversion device of claim 8, wherein the layer containing the fullerene or fullerene derivatives of 10% or less in volume ratio is in contact with the electrode.

10. The photoelectric conversion device of claim 1, wherein the content of the fullerene or fullerene derivative contained in the mixed layer is 30% to 70% in volume ratio.

11. The photoelectric conversion device of claim 10, wherein the mixed layer is in contact with the photoelectric conversion layer.

12. The photoelectric conversion device according to claim 1, wherein the photoelectric conversion layer has a bulk hetero layer contains an n-type organic semiconductor material and a p-type organic semiconductor material.

13. The photoelectric conversion device of claim 12, wherein the n-type organic semiconductor material is fullerene or fullerene derivative.

14. The photoelectric conversion device of claim 13, wherein the bulk hetero layer contains the fullerene or fullerene derivative of 40% to 80% in volume ratio.

* * * * *